(12) United States Patent
Weyers

(10) Patent No.: US 9,991,252 B2
(45) Date of Patent: Jun. 5, 2018

(54) SEMICONDUCTOR DEVICE COMPRISING ELECTROSTATIC DISCHARGE PROTECTION STRUCTURE

(71) Applicant: Infineon Technologies Dresden GmbH, Dresden (DE)

(72) Inventor: Joachim Weyers, Hoehenkirchen (DE)

(73) Assignee: Infineon Technologies Dresden GmbH, Dresden (DE)

(*) Notice: Subject to any disclaimer, the term of this patent is extended or adjusted under 35 U.S.C. 154(b) by 0 days. days.

(21) Appl. No.: 15/167,141

(22) Filed: May 27, 2016

(65) Prior Publication Data

US 2016/0351557 A1 Dec. 1, 2016

(30) Foreign Application Priority Data

May 29, 2015 (DE) .......................... 10 2015 108 537

(51) Int. Cl.
| | |
|---|---|
| *H01L 27/02* | (2006.01) |
| *H01L 29/78* | (2006.01) |
| *H01L 29/10* | (2006.01) |
| *H01L 29/06* | (2006.01) |
| *H01L 23/367* | (2006.01) |

(52) U.S. Cl.
CPC ...... *H01L 27/0255* (2013.01); *H01L 23/3677* (2013.01); *H01L 29/0634* (2013.01); *H01L 29/0696* (2013.01); *H01L 29/1095* (2013.01); *H01L 29/7805* (2013.01); *H01L 29/7811* (2013.01)

(58) Field of Classification Search
None
See application file for complete search history.

(56) References Cited

U.S. PATENT DOCUMENTS

| | | | |
|---|---|---|---|
| 6,383,892 B1 | 5/2002 | Colt, Jr. | |
| 2013/0234237 A1* | 9/2013 | Hsieh | H01L 27/0255 257/328 |
| 2015/0340356 A1* | 11/2015 | Naito | H01L 29/405 257/49 |

FOREIGN PATENT DOCUMENTS

| | | |
|---|---|---|
| EP | 1041634 A1 | 10/2000 |
| WO | 2014142331 A1 | 9/2014 |

\* cited by examiner

*Primary Examiner* — Matthew Reames
*Assistant Examiner* — Steven B Gauthier
(74) *Attorney, Agent, or Firm* — Murphy, Bilak & Homiller, PLLC

(57) ABSTRACT

A semiconductor device includes a semiconductor body having first and second opposing surfaces, a first isolation layer on the first surface of the semiconductor body, and an electrostatic discharge protection structure. The electrostatic discharge protection structure includes a diode structure on the first isolation layer, a first terminal and a second terminal. The diode structure includes a polysilicon layer having first regions and at least one second region of opposite conductivity type alternatingly arranged along a first lateral direction between the first terminal and the second terminal. The diode structure extends from an electrostatic discharge protection part into an edge termination part along a second lateral direction. A first breakdown voltage associated with the diode structure in the electrostatic discharge protection part is smaller than a second breakdown voltage associated with the diode structure in the edge termination part.

20 Claims, 34 Drawing Sheets

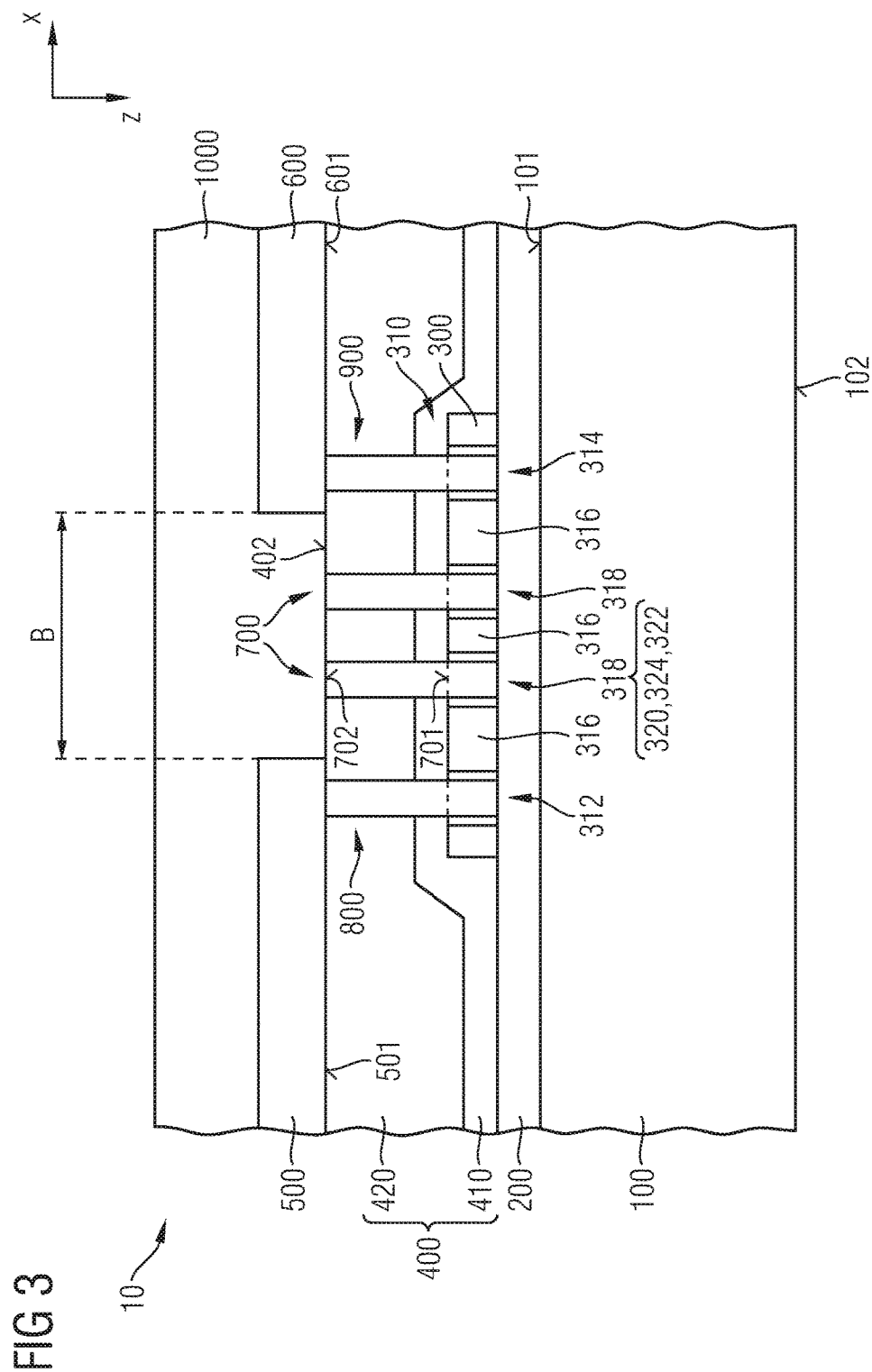

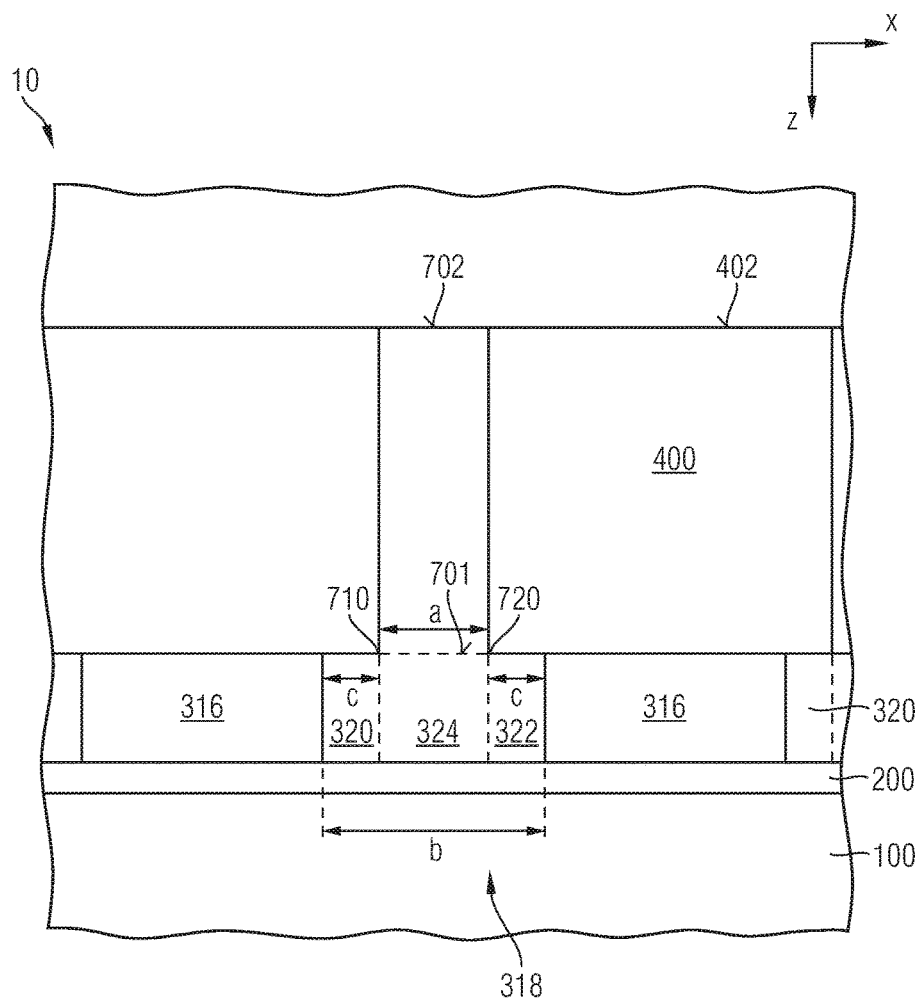

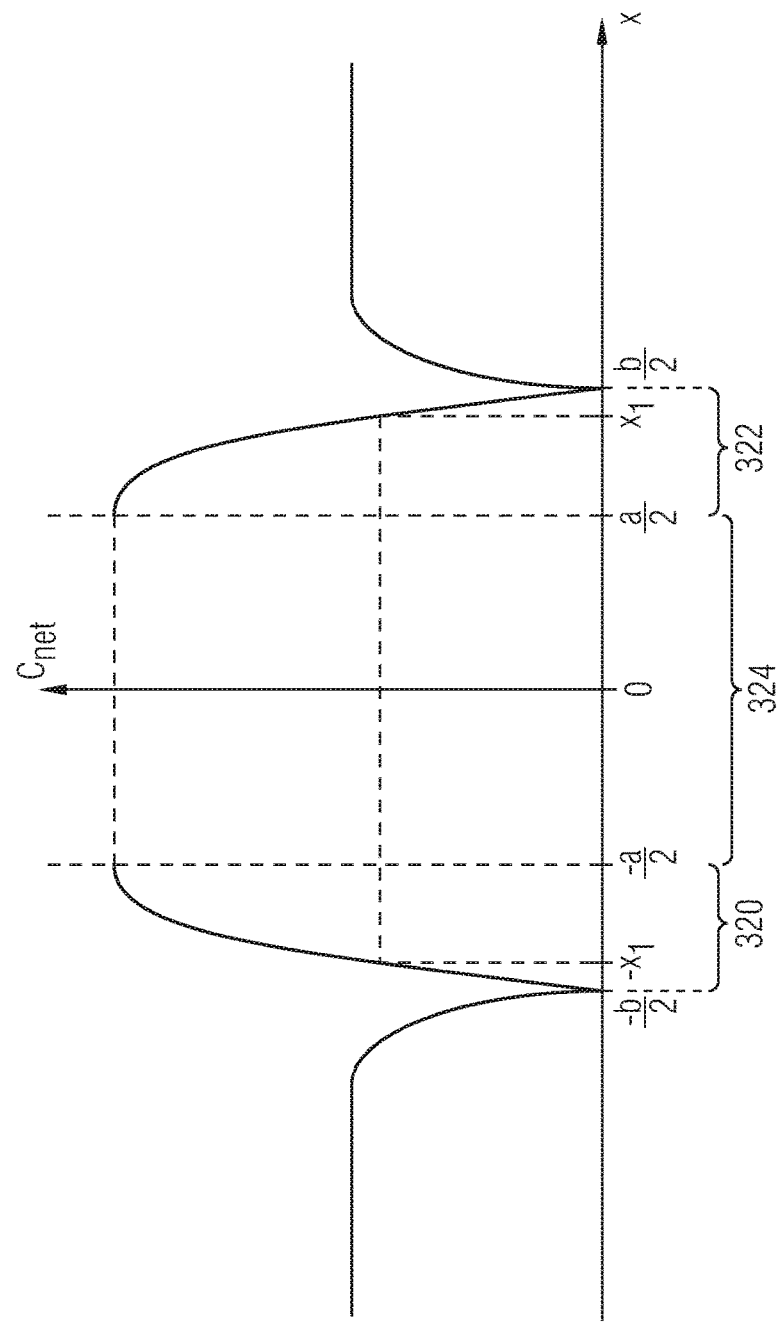

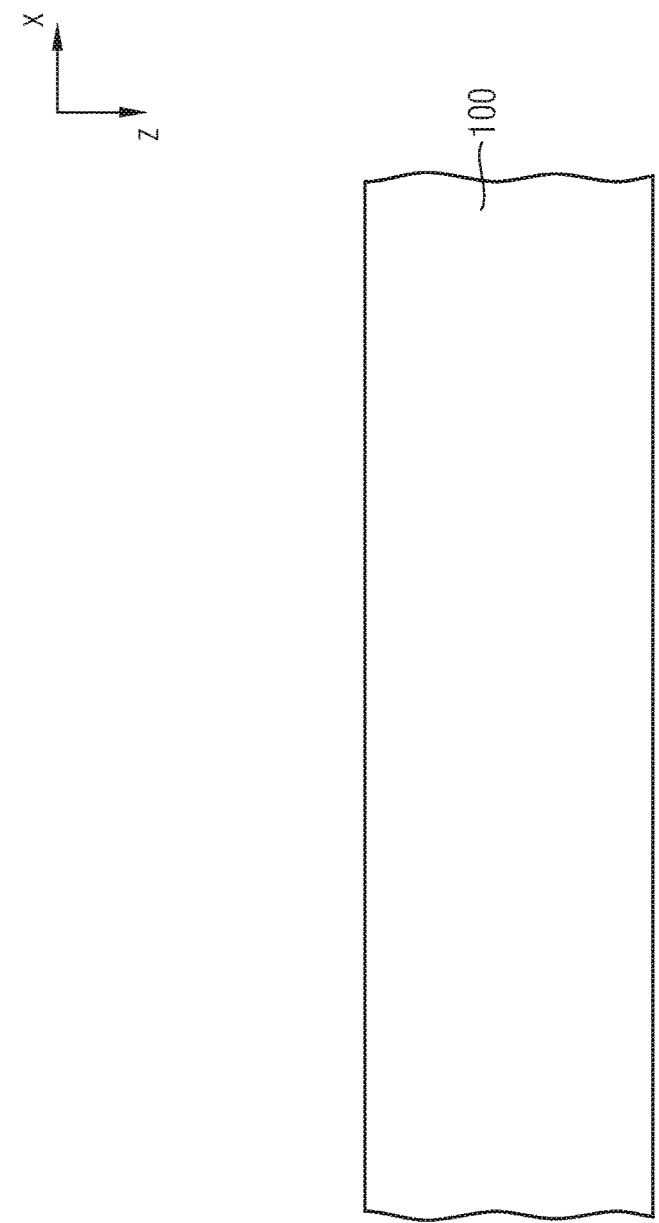

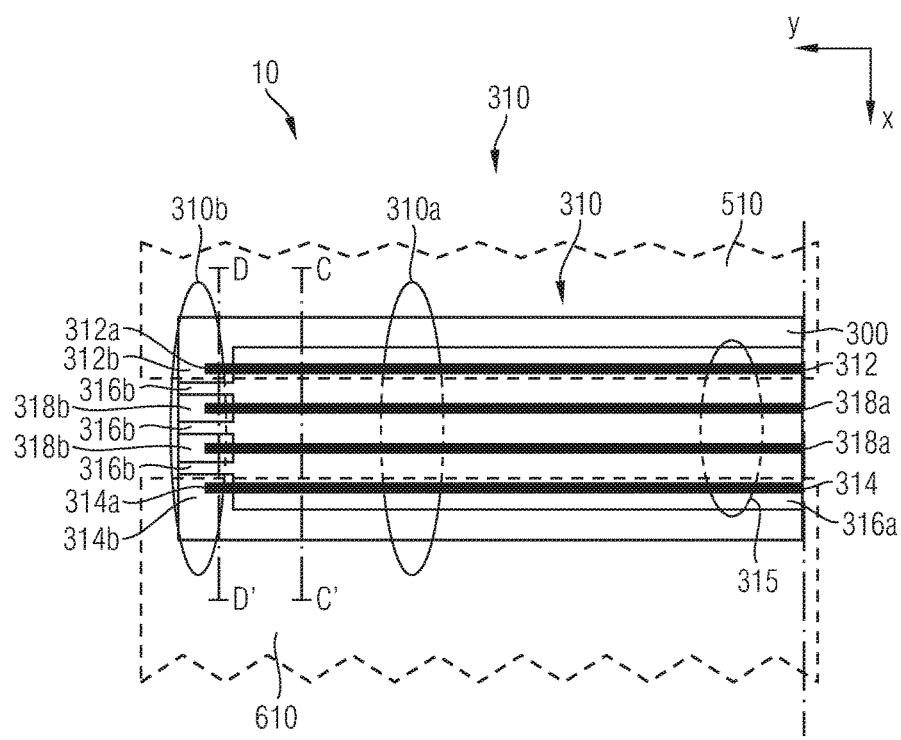

SEMICONDUCTOR DEVICE COMPRISING ELECTROSTATIC DISCHARGE PROTECTION STRUCTURE

PRIORITY CLAIM

This application claims priority to German Patent Application No. 10 2015 108 537.2 filed on 29 May 2015, the content of said application incorporated herein by reference in its entirety.

BACKGROUND

A key component in semiconductor applications is a solid-state switch. As an example, switches turn loads of automotive applications or industrial applications on and off. Solid-state switches typically include, for example, field effect transistors (FETs) like metal-oxide-semiconductor FETs (MOSFETs) or insulated gate bipolar transistors (IGBTs).

In these applications, a damage of a gate dielectric between gate and source of the transistors may be caused by an electrostatic discharge event between a gate contact area and a source contact area of the semiconductor device. To protect the gate dielectric from an electrostatic discharge event, electrostatic discharge (ESD) protection structures are provided, which protect the transistors from electrostatic discharge during assembly or operation, for example. These ESD protection structures require non-negligible area within the integrated semiconductor device.

It is further beneficial to increase the thermoelectric safe operating area of an ESD structure to achieve a predetermined electrostatic discharge robustness while having at the same time a reduced area consumption of the ESD protection structure.

It is thus desirable to provide a semiconductor device structure with enhanced ESD protection and thermal characteristics, having at the same time an optimized area efficiency.

SUMMARY

According to an embodiment of a semiconductor device, the semiconductor device comprises a semiconductor body having a first surface and a second surface opposite to the first surface. The semiconductor device further comprises a first isolation layer on the first surface of the semiconductor body. In addition, the semiconductor device comprises an electrostatic discharge protection structure. The electrostatic discharge protection structure comprises a diode structure on the first isolation layer. The electrostatic discharge protection structure includes a first terminal and a second terminal. The diode structure comprises a polysilicon layer having first regions and at least one second region of opposite conductivity type alternatingly arranged along a first lateral direction between the first terminal and the second terminal. The diode structure extends from an electrostatic discharge protection part into an edge termination part along a second lateral direction. A first breakdown voltage associated with the diode structure in the electrostatic discharge protection part is smaller than a second breakdown voltage associated with the diode structure in the edge termination part.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 3 is a schematic cross-sectional view of a portion of a semiconductor device taken along a section plane A-A' of FIG. 2A or FIG. 2B in accordance with an embodiment.

FIG. 4 is a detailed view of a portion of a semiconductor device of FIG. 3.

FIG. 5A is a diagram illustrating a net dopant profile along a first lateral direction within an electrostatic discharge protection structure of a semiconductor device in accordance with an embodiment.

FIGS. 10A to 10G are cross-sectional views illustrating a method of manufacturing a semiconductor device in accordance with an embodiment.

FIG. 14 is a schematic plan view of a portion of a semiconductor device comprising an electrostatic discharge protection structure formed in a polysilicon layer of a second conductivity type in accordance with an embodiment.

DETAILED DESCRIPTION

Figure 1A:
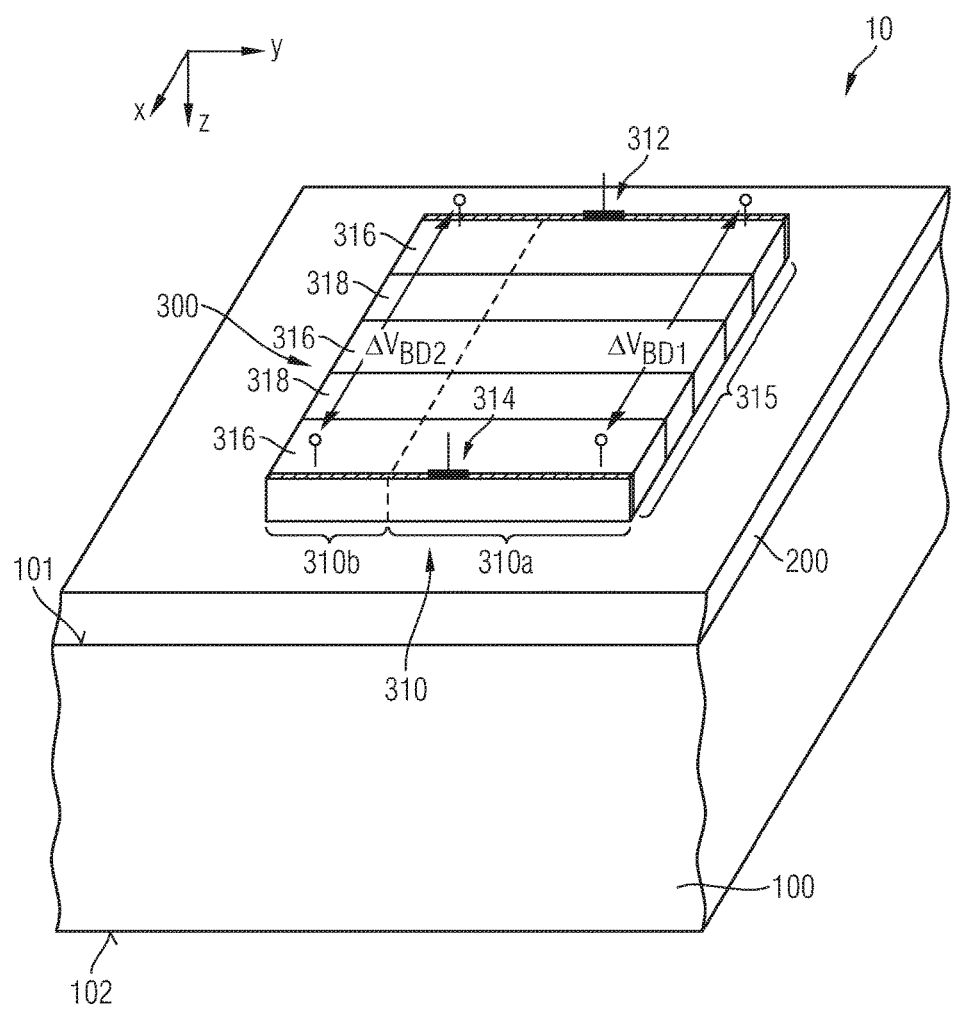
FIG. 1A is a schematic perspective view of a portion of a semiconductor device comprising an electrostatic discharge protection structure in accordance with an embodiment.

In the following detailed description, reference is made to the accompanying drawings, which form a part hereof, and in which are shown by way of illustrations specific embodiments in which the invention may be practiced. It is to be understood that other embodiments may be utilized and structural and logical changes may be made without departing from the scope of the present invention. For example, features illustrated or described for one embodiment can be used on or in conjunction with other embodiments to yield yet a further embodiment. It is intended that the present invention include such modifications and variations. The examples are described using specific language, which should not be construed as limiting the scope of the appending claims. The drawings are not scaled and for illustrative purpose only. For clarity, corresponding elements have been designated by the same references in the different drawings if not stated otherwise.

The terms "having", "containing", "including", "comprising" and the like are open and the terms indicate the presence of stated structures, elements or features but not preclude additional elements or features.

The terms "one after another", "successively" and the like indicate a loose ordering of elements not precluding additional elements placed in between the ordered elements.

The articles "a", "an", and "the" are intended to include the plural as well as the singular, unless the context clearly indicates otherwise.

In this specification, n-type or n-doped may refer to a first conductivity type while p-type or p-doped is referred to a second conductivity type. Semiconductor devices can be formed with opposite doping relations so that the first conductivity type can be p-doped and the second conductivity type can be n-doped. Furthermore, some figures illustrate relative doping concentrations by indicating "−" or "+" next to the doping type. For example, "$n^-$" means a doping concentration less than the doping concentration of an "n"-doping region while an "$n^+$"-doping region has a larger doping concentration than the "n"-doping region. Indicating the relative doping concentration does not, however, mean that doping regions of the same relative doping concentration have the same absolute doping concentration unless otherwise stated. For example, two different $n^+$ regions can have different absolute doping concentrations. The same applies, for example, to an $n^+$ and a $p^+$ region.

The first conductivity type may be n- or p-type provided that the second conductivity type is complementary.

The term "electrically connected" describes a permanent low-ohmic connection between electrically connected elements, for example a direct contact between the concerned elements or a low-ohmic connection via a metal and/or highly doped semiconductor.

The terms "wafer", "substrate", "semiconductor body" or "semiconductor substrate" used in the following description may include any semiconductor-based structure that has a semiconductor surface. Wafer and structure are to be understood to include silicon (Si), silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon germanium (SiGe), germanium (Ge) or gallium arsenide (GaAs). According to other embodiments, silicon carbide (SiC) or gallium nitride (GaN) may form the semiconductor substrate material.

The term "horizontal" as used in this specification intends to describe an orientation substantially parallel to a first or main surface of a semiconductor substrate or body. This can be for instance the surface of a wafer or a die.

The term "vertical" as used in this specification intends to describe an orientation which is substantially arranged perpendicular to the first surface, i.e. parallel to the normal direction of the first surface of the semiconductor substrate or body.

Processing of a semiconductor wafer may result in semiconductor devices having terminal contacts such as contact pads (or electrodes) which allow electrical contact to be made with the integrated circuits or discrete semiconductor devices included in the semiconductor body. The electrodes may include one or more electrode metal layers which are applied to the semiconductor material of the semiconductor chips. The electrode metal layers may be manufactured with any desired geometric shape and any desired material composition. The electrode metal layers may, for example, be in the form of a layer covering an area. Any desired metal, for example Cu, Ni, Sn, Au, Ag, Pt, Pd, and an alloy of one or more of these metals may be used as the material. The electrode metal layer(s) need not be homogenous or manufactured from just one material, that is to say various compositions and concentrations of the materials contained in the electrode metal layer(s) are possible. As an example, the electrode layers may be dimensioned large enough to be bonded with a wire.

In embodiments disclosed herein one or more conductive layers, in particular electrically conductive layers, are applied. It should be appreciated that any such terms as "formed" or "applied" are meant to cover literally all kinds and techniques of applying layers. In particular, they are meant to cover techniques in which layers are applied at once as a whole like, for example, laminating techniques as well as techniques in which layers are deposited in a sequential manner like, for example, sputtering, plating, molding, CVD (Chemical Vapor Deposition), physical vapor deposition (PVD), evaporation, hybrid physical-chemical vapor deposition (HPCVD), etc.

The applied conductive layer may comprise, inter alia, one or more of a layer of metal such as Cu or Sn or an alloy thereof, a layer of a conductive paste and a layer of a bond material. The layer of a metal may be a homogeneous layer. The conductive paste may include metal particles distributed in a vaporizable or curable polymer material, wherein the paste may be fluid, viscous or waxy. The bond material may be applied to electrically and mechanically connect the semiconductor chip, e.g., to a carrier or, e.g., to a contact clip. A soft solder material or, in particular, a solder material capable of forming diffusion solder bonds may be used, for example solder material comprising one or more of Sn, SnAg, SnAu, SnCu, In, InAg, InCu and InAu.

A dicing process may be used to divide the semiconductor wafer into individual chips. Any technique for dicing may be applied, e.g., blade dicing (sawing), laser dicing, etching, etc. The semiconductor body, for example a semiconductor wafer may be diced by applying the semiconductor wafer on a tape, in particular a dicing tape, apply the dicing pattern, in particular a rectangular pattern, to the semiconductor wafer, e.g., according to one or more of the above mentioned techniques, and pull the tape, e.g., along four orthogonal directions in the plane of the tape. By pulling the tape, the semiconductor wafer gets divided into a plurality of semiconductor dies (chips).

It is to be understood that the features of the various embodiments described herein may be combined with each other, unless specifically noted otherwise.

FIG. 1A is a schematic perspective view of a portion of a semiconductor device 10 comprising an electrostatic discharge protection structure 310 in accordance with an embodiment.

The semiconductor device 10 comprises a semiconductor body 100 having a first surface 101 and a second surface 102 opposite to the first surface 101. The semiconductor device 10 further comprises a first isolation layer 200 on the first surface 101 of the semiconductor body 100. In addition, the semiconductor device 10 comprises an electrostatic discharge protection structure 310. The electrostatic discharge protection structure 310 comprises a diode structure 315 on the first isolation layer 200. The electrostatic discharge protection structure 310 includes a first terminal 312 and a second terminal 314. The diode structure 315 comprises a polysilicon layer 300 having first regions 316 and at least one second region 318 of opposite conductivity type alternatingly arranged along a first lateral direction x between the first terminal 312 and the second terminal 314. The diode structure 315 extends from an electrostatic discharge protection part 310a into an edge termination part 310b along a second lateral direction y. A first breakdown voltage $\Delta V\_BD1$ associated with the diode structure 315 in the electrostatic discharge protection part 310a is smaller than a second breakdown voltage $\Delta V\_BD2$ associated with the diode structure 315 in the edge termination part 310b.

As can be seen from FIG. 1A, the first breakdown voltage $\Delta V\_BD1$ shall be understood as a breakdown voltage of the diode structure 315, which is extended between the first and second terminals 312, 314 in the first lateral direction x. Herein, the inner structure of the diode structure 315 is different in the electrostatic discharge protection part 310a in comparison to the edge termination part 310b of the electrostatic discharge protection structure 310. The details of the different structures of the electrostatic discharge protection part 310a and the edge termination part 310b will be explained below with regard to FIGS. 1B to 1D and with regard to FIGS. 14 to 19.

The first breakdown voltage $\Delta V\_BD1$ associated with the diode structure 315 in the electrostatic discharge protection part 310a may be defined as a breakdown voltage of the diode structure 315 measured between a first end located at the first terminal 312 and a second end located at the second terminal 314 of the diode structure 315 along the first lateral direction x. The second breakdown voltage $\Delta V\_BD2$ associated with the diode structure 315 in the edge termination part 310b may be defined as a breakdown voltage of the diode structure 315 measured between a first end located on the same side as the first terminal 312 and a second end located at the same side as the second terminal 314 of the diode structure 315 in the edge termination part 310b.

In case the first terminal 312 and the second terminal 314 are formed in the polysilicon layer 300, the first end of the diode structure 315 in the electrostatic discharge protection part 310a may be defined as a boundary portion of a first region 316 in the polysilicon layer 300 abutting the first terminal 312. The second end of the diode structure 315 in the electrostatic discharge protection part 310a may be defined as a boundary portion of the first region 316 in the polysilicon layer 300 abutting the second terminal 314. The second breakdown voltage of the diode structure 315 in the edge termination part 310b is measured between the two outermost first regions 316 in the polysilicon layer 300 in a first lateral direction x.

Due to the provision of an edge termination part 310b of the electrostatic discharge protection structure 310, having a higher breakdown voltage than that of the electrostatic discharge protection part 310a, the breakdown voltage of the complete electrostatic discharge protection structure 310 is defined by the breakdown voltage $\Delta VBD1$ of the electrostatic discharge protection part 310a. Thus, a well-defined breakdown voltage of the electrostatic discharge protection structure 310 may be achieved.

Figure 1B:
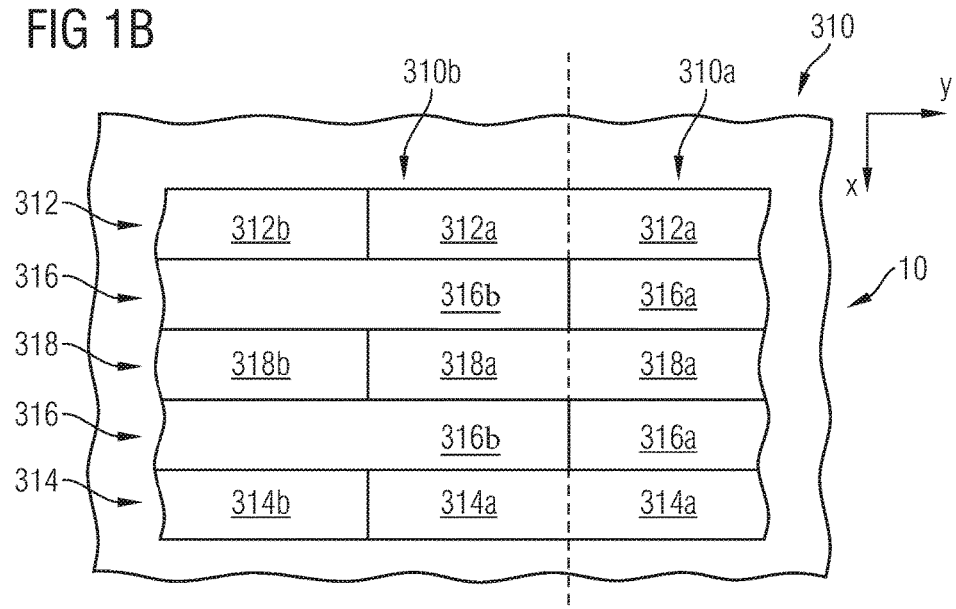
FIGS. 1B to 1D are schematic plan views of a portion of a semiconductor device comprising an electrostatic discharge protection structure in accordance with different embodiments.
Figure 1C:
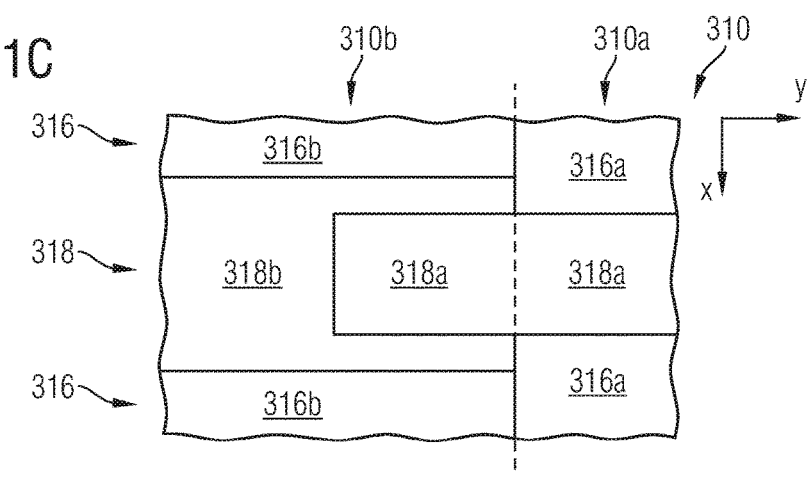
Figure 1D:
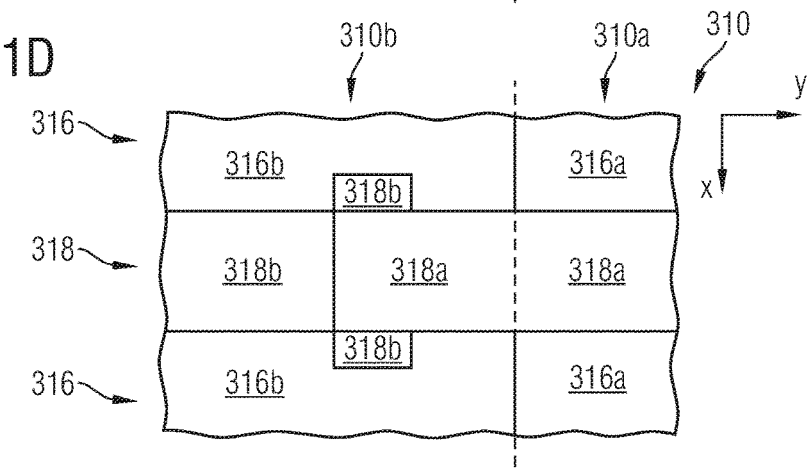

FIGS. 1B to 1D are schematic plan views of a portion of a semiconductor device 10 comprising the electrostatic discharge protection structure 310 in accordance with different embodiments.

As can be seen from FIG. 1B, the at least one second region 318 may comprise a second region main part 318a in the electrostatic discharge protection part 310a and the edge termination part 310b, and a second region end part 318b in the edge termination part 310b. Thus, the second region main part 318a may be extended from the electrostatic discharge protection part 310a into the edge termination part 310b, wherein the second region end part 318b is located in the edge termination part 310b only. The net dopant concentration in the second region end part 318b may be lower than the net dopant concentration averaged in the second region main part 318a.

As can be seen from FIG. 1B to 1D, the second region end part 318b may be arranged next to the second region main part 318a along the second lateral direction y. The second lateral direction y may be a direction being orthogonal to the first lateral direction x.

As can be further seen from FIGS. 1C and 1D, the second region end part 318b may be arranged next to the second region main part 318a along the first lateral direction x. As can be seen from FIG. 1C, the second region end part 318b may have a U-form surrounding the second region main part 318a within the edge termination part 310b. As can be seen from FIG. 1D, the second region end part 318b may also comprise separate regions neighbouring the second region main part 318a both in the first lateral direction x and the second lateral direction y.

As can be further seen from FIG. 1B, the first regions 316 may be each comprise a first region main part 316a in the electrostatic discharge protection part 310a and a first region end part 316b in the edge termination part 310b. Herein, the net dopant concentration averaged in the first region end part 316b may be lower than the net dopant concentration averaged in the first region main part 316a.

As will be discussed below with regard to FIG. 14, the first terminal 312 and the second terminal 314 may include a region of the polysilicon layer 300 of the second conductivity type. Thus, the first terminal 312 and the second terminal 314 may be a region of the polysilicon layer 300 of the same conductivity type as the at least one second region 318. Thus, the diode structure 315 between the first terminal 312 and the second terminal 314 may abut to a region of a second conductivity type of the first terminal 312 at its one end along the first lateral direction x and abut to a region of a second conductivity type of the second terminal 314 at its opposite end along the first lateral direction x.

The first terminal 312 may comprise a first terminal main part 312a in the electrostatic discharge protection part 310a and the edge termination part 310b, and a first terminal end part 312b in the edge termination part 310b. Herein, the net dopant concentration averaged in the first terminal end part 312b may be lower than the net dopant concentration averaged in the first terminal main part 312a. In addition, the second terminal 314 may comprise a second terminal main part 314a in the electrostatic discharge protection part 310a and the edge termination part 310b, and a second terminal end part 314b in the edge termination part 310b, wherein the net dopant concentration averaged in the second terminal end part 314b may be lower than the net dopant concentration averaged in the second terminal main part 314a.

The semiconductor device 10 may comprise power semiconductor elements such as IGBTs (insulated gate bipolar transistors), e.g. RC-IGBTs (reverse-conducting IGBTs), RB-IGBT (reverse-blocking IGBTs, and IGFETs (insulated gate field effect transistors) including MOSFETs (metal oxide semiconductor field effect transistors). The semiconductor device 10 may also comprise a superjunction transistor, a trench field effect transistor, or any further transistor device controlling a load current via a control terminal.

When reducing the chip size of the semiconductor device 10, a smaller input capacitance results in an enhanced risk of damage caused by an electrostatic discharge event between the gate and the source of the semiconductor device 10. Thus, the electrostatic discharge protection structure 310 may be applied in a power semiconductor element to protect a gate dielectric between a gate and source of a transistor from damage by dissipating energy caused by an electrostatic discharge event between a gate contact area and a source contact area.

Figure 2A:
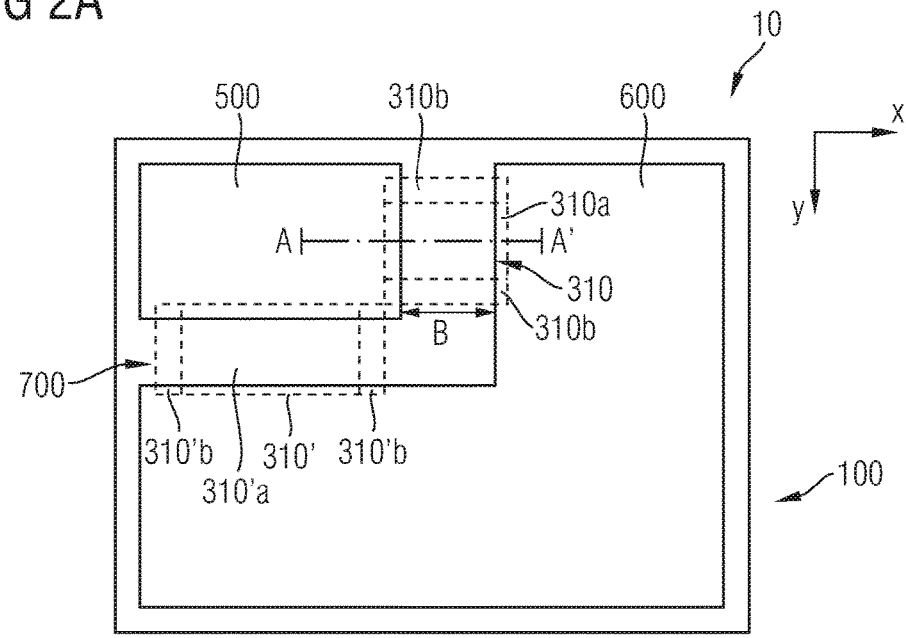
FIGS. 2A and 2B are schematic plan views of a portion of a semiconductor device in accordance with different embodiments.
Figure 2B:
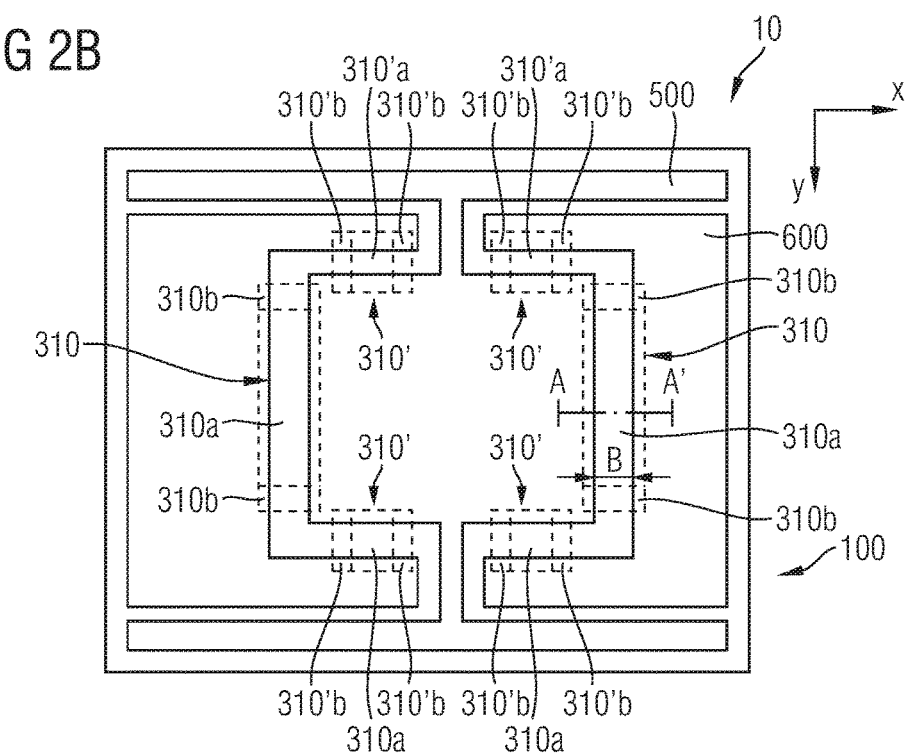

FIGS. 2A and 2B are schematic plan views of portions of a semiconductor device 10 in accordance with different embodiments. As shown in FIG. 2A, a first electrode 500 is provided in a corner portion of the semiconductor device 10 and may act as a gate contact area 510 (cf. FIG. 8), which may include a gate pad. The gate pad may be used for providing a bonding or soldering contact to the first electrode 500 to be connected to an external device or element. A second electrode 600 is arranged next to the first electrode 500 and may act as a source contact area 610 (cf. FIG. 8), by which source zones 150 of transistor cells 20 in the semiconductor body 100 are contacted.

When forming the semiconductor device 10 as a power semiconductor element, a resulting thickness of the metallization of the first electrode 500 and the second electrode 600 may be in a range of 1 µm to 10 µm or 3 µm to 7 µm, and the first electrode 500 and the second electrode 600 may be separated by a minimum distance B in a range of 5 µm to 20 µm or 10 µm to 15 µm. As shown in FIG. 2B, the first electrode 500 may be also be arranged in a middle part of the semiconductor device 10, wherein the second electrode 600 surrounds the first electrode 500.

As can be seen from FIGS. 2A and 2B, the edge termination part 310b of the electrostatic discharge protection structure 310 is arranged at side portions of the electrostatic discharge protection part 310a along the second lateral direction y. A further detailed discussion of the lateral structure of the electrostatic discharge protection part 310a and the edge termination part 310b will be given with respect to FIG. 14 to 19. In the following, the detailed layer structure along a vertical direction z of the semiconductor device 10 comprising the electrostatic discharge protection structure 310 and a respective manufacturing process thereof will be discussed.

FIG. 3 is a schematic cross-sectional view of a portion of the semiconductor device 10 taken along a section plane A-A' of FIG. 2A or FIG. 2B in accordance with an embodiment. FIG. 3 illustrates the layer structure of the semiconductor device 10, wherein the section plane A-A' crosses an electrostatic discharge protection part 310a of the electrostatic discharge protection structure 310. It shall be noted that the structure of the edge termination part 310b will be discussed below with regard to FIGS. 14 to 19, wherein the layer structure of the edge termination part 310b may comprise similar components as the electrostatic discharge protection part 310a discussed in the following.

The semiconductor body 100 may be provided from a single-crystalline semiconductor material, for example silicon Si, silicon carbide SiC, germanium Ge, a silicon germanium crystal SiGe, gallium nitride GaN or gallium arsenide GaAs. A distance between the first and second surfaces 101, 102 is selected to achieve a specified voltage blocking capability and may be at least 20 µm, for example at least 50 µm. Other embodiments may provide semiconductor bodies with a thickness of several 100 µm. The semiconductor body 100 may have a rectangular shape with an edge length in the range of several millimeters.

Figure 19:
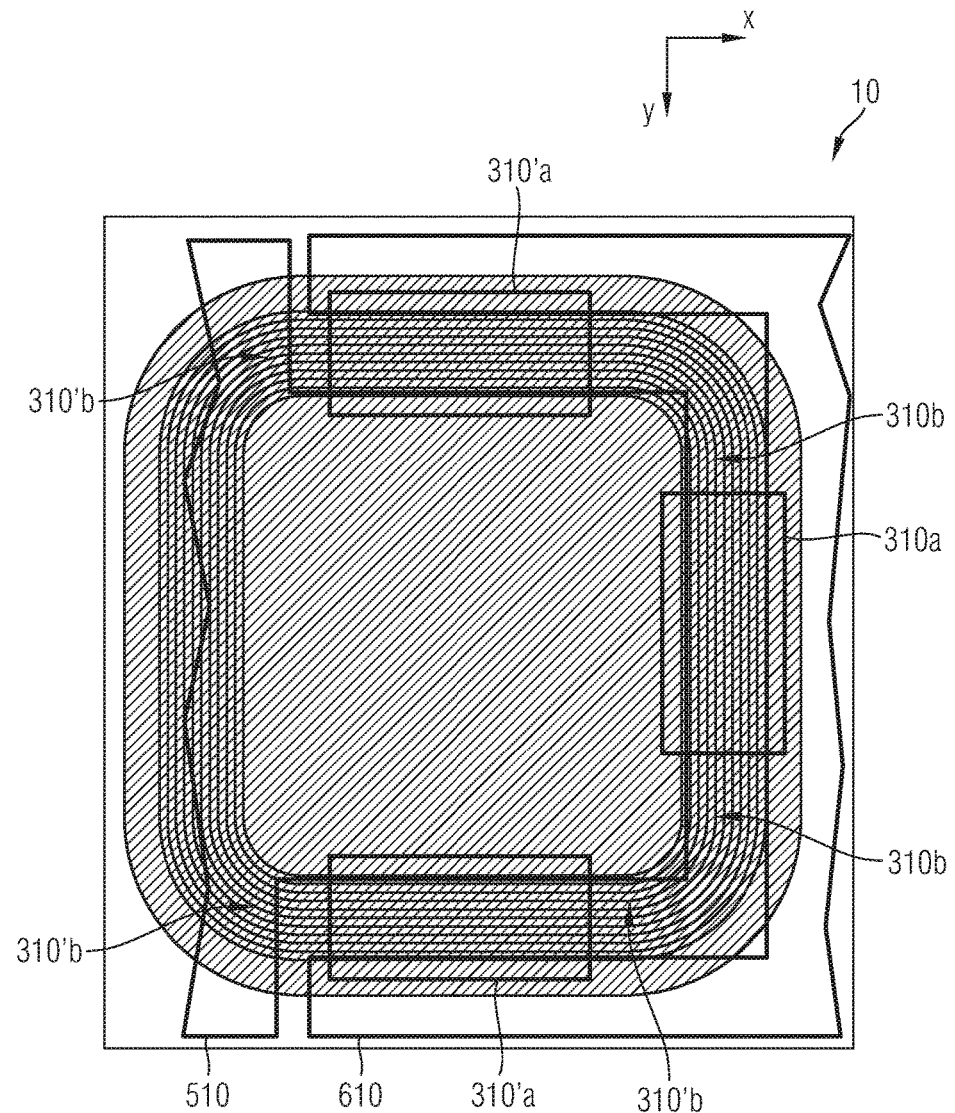
FIG. 19 is a schematic plan view of a portion of a semiconductor device comprising separate electrostatic discharge protection parts each sharing first region end parts having a form of a closed loop in accordance with an embodiment.

The normal to the first and second surfaces 101, 102 defines the vertical direction z and directions orthogonal to the normal direction are first and second lateral directions x, y. As can be seen, for example, from FIGS. 2A, 2B and 3, the first lateral direction x is defined to be extended between the first terminal 312 and the second terminal 314, or from the first terminal 312 to the second terminal 314. Thus, the first lateral direction x is effectively parallel to the direction of a breakdown current within the electrostatic discharge protection structure 310 and the second lateral direction y is effectively orthogonal to the breakdown current within the electrostatic discharge protection structure 310. For the sake of an unambiguous understanding of the invention, the first lateral direction x may be defined to be extended along the section plane A-A' of FIG. 2A or FIG. 2B. However, it can easily be understood by a person skilled in the art that within an electrostatic discharge protection structure 310' as shown in FIG. 2A, FIG. 2B or FIG. 19, the first lateral direction has to be defined as a direction being orthogonal to the above-defined lateral direction x, i.e. as a first lateral direction y. Herein, the lateral direction x has to be defined as a second lateral direction. Furthermore, as can be seen from FIG. 8, the first lateral direction x may be extended even in opposite directions.

The first isolation layer 200 is formed on the first surface 101 of the semiconductor body 100. The first isolation layer 200 may include any dielectric or a combination of dielectrics adapted to isolate the semiconductor body 100 from the electrostatic discharge protection structure 310 on the first isolation layer 200. The first isolation layer 200 may include one or any combination of an oxide, nitride, oxynitride, a high-k material, an imide, an insulating resin or glass, for example. The first isolation layer 200 may include a field dielectric such as a field oxide and/or a gate dielectric such as a gate oxide. The first isolation layer 200 may include a field oxide formed e.g. by a local oxidation of silicon (LOCOS) process, deposited oxide or STI (shallow trench isolation). The thickness of the field dielectric of the first isolation layer 200 may be in a range of 0.5 µm to 5 µm or 1 µm to 3 µm, the thickness of the gate dielectric of the first isolation layer 200 may be in a range of 5 nm to 200 nm or 40 nm to 120 nm.

The second isolation layer 400 is formed on the electrostatic discharge protection structure 310 and the first isolation layer 200. The second isolation layer may comprise silicon nitride. The second isolation layer 400 may comprise a stack of a first and a second dielectric layers 410 and 420. According to an embodiment, the first dielectric layer 410 may include a tetraethyl orthosilicate (TEOS)/undoped silicate glass (USG) film. The thickness of the first dielectric layer of the second isolation layer 400 may be in a range of 50 nm to 500 nm. The second dielectric layer 420 may include a phosphosilicate glass (PSG) or a borophosphosilicate glass (BPSG). The thickness of the second dielectric layer of the second isolation layer 400 may be in a range of 200 nm to 2 µm.

The first electrode 500 is formed on the second isolation layer 400. Next to the first electrode 500, the second electrode 600 is formed on the second isolation layer 400, which may be spaced apart from the first electrode 500 by the distance B (cf. also FIG. 2A and FIG. 2B). On the first electrode 500 and the second electrode 600, a passivation layer 1000 is formed, which may include one or any combination of an imide, a nitride, an oxide or an oxynitride, for example.

The first electrode 500 and the second electrode 600 may be separate parts, e.g. due to lithographic patterning of a common metal wiring layer, wherein the semiconductor device 10 comprises only a single metal wiring layer. The first electrode 500 and the second electrode 600 may be formed as a metal layer structure, which may consist of or contain, as main constituent(s), aluminum Al, copper Cu or alloys of aluminum or copper, for example AlSi, AlCu, or AlSiCu. According to other embodiments, the first electrode 500 and the second electrode 600 may contain one, two, three or more sub-layers, each sub-layer containing, as a main constituent, at least one of nickel Ni, titanium Ti, silver Ag, gold Au, tungsten W, platinum Pt, tantalum Ta and palladium Pd. For example, a sub-layer may contain a metal nitride or a metal alloy containing Ni, Ti, Ag, Au, W, Pt, Co and/or Pd.

The electrostatic discharge protection structure 310 may include a series connection of at least one polysilicon diode. As shown in FIG. 3, the electrostatic discharge protection structure 310 may comprise a polysilicon layer 300 on the first isolation layer 200 having first regions 316 and at least one second region 318 of opposite conductivity type alternatingly arranged along the first lateral direction x. The second region 318 comprises the first and second outdiffusion regions 320, 322. According to the embodiment as shown in FIG. 3, the first terminal 312 and the second terminal 314 within the polysilicon layer 300 may have the same conductivity type as the second region 318. The first regions 316 and the first and second outdiffusion regions 320, 322 may comprise first dopants of a first conductivity type, and the first and second outdiffusion regions 320, 322 may further comprise second dopants of the second conductivity type overcompensating the first dopants.

As will be described in more detail below, the electrostatic discharge protection structure 310 may be manufactured by forming trenches penetrating the polysilicon layer 300 of a first conductivity type, and forming the first and second outdiffusion regions 320, 322 of a second conductivity type in the polysilicon layer 300 to form alternatingly arranged first regions 316 of the first conductivity type and second regions 318 of the second conductivity type. The trenches therefor may be filled with a conductive material or a highly doped polysilicon material.

As can be seen from FIG. 3 and in more detail in FIG. 4, the electrostatic discharge protection structure 310 may further comprise an intermediate region 324. The intermediate region 324 may be sandwiched between the first and second outdiffusion regions 320, 322 in the first lateral direction x. The intermediate region 324 may be further sandwiched between the first isolation layer 200 and the first end 701 of the heat dissipation structure 700 in the vertical direction z.

The second region 318 may comprise the first outdiffusion region 320, the intermediate region 324 and the second outdiffusion region 322 consecutively arranged in this order along the first lateral direction x. The intermediate region 324 and the heat dissipation structure 700 may include a same material. According to an embodiment, the intermediate region 324 may comprise n-doped polysilicon having a net dopant concentration higher than $1 \times 10^{17}$ cm$^{-3}$, or higher than $1 \times 10^{18}$ cm$^{-3}$, or higher than $1 \times 10^{19}$ cm$^{-3}$, or higher than $5 \times 10^{19}$ cm$^{-3}$, or higher than $2 \times 10^{20}$ cm$^{-3}$. According to another embodiment, the intermediate region 324 may comprise a metal. Basically the electrostatic discharge protection function of the electrostatic discharge protection structure 310 may also be provided by employing an intermediate region 324 comprising n-doped polysilicon having a net dopant concentration lower than $1 \times 10^{16}$ cm$^{-3}$. A lower net dopant concentration, however, may lead to an enhancement of the differential path resistance and a breakdown voltage of the electrostatic discharge protection structure 310. However, the benefit of a self-aligned ESD protection structure will be preserved.

As a result, a polysilicon diode chain or string arranged in a first lateral direction x having alternating pn-junctions (diodes) at the region boundaries of the first and second regions 316, 318 in the polysilicon layer 300 is formed. In an embodiment, the doping concentrations of the regions are adapted such that series connections of Zener diodes are formed within the polysilicon layer 300. By the number of consecutive diodes each including a first region 316 and a second region 318, the breakdown voltage of the electrostatic discharge protection structure 310 can be adjusted.

The polysilicon layer 300 deposited on the first isolation layer 200 may have a large grain-size of polysilicon. Thus, the lateral dimension of the electrostatic discharge protection structure 310 comprising a poly Zener diode chain may be e.g. in a range of 1 µm to 10 µm or 3 µm to 5 µm. By extending the electrostatic discharge protection structure 310 over a plurality of grain boundaries of the polysilicon layer 300, a stable breakdown characteristic of the electrostatic discharge protection structure 310 is provided. In some embodiments, a plurality of grain boundaries within the polysilicon layer 300 may lead to an electron mobility in a range of 1 $cm^2$/Vs to 5 $cm^2$/Vs. In case of improving the granular structure of the polysilicon layer 300, the electron mobility may be increased to 50 $cm^2$/Vs due to less grain boundaries within the polysilicon layer 300. A further improvement may be achieved by depositing amorphous silicon followed by a laser melting process. Such a polycrystalline silicon is called low temperature polysilicon (LTPS). The electron mobility of low temperature polysilicon is in a range of 100 $cm^2$/Vs to 700 $cm^2$/Vs.

Even higher electron mobility values may be achieved by polycrystalline silicon having even greater grain-boundary sizes. An example of such a polycrystalline silicon is a continuous-grain-silicon (CGS), which leads to an electron mobility in a range of 500 $cm^2$/Vs to 700 $cm^2$/Vs. By provision of a continuous grain silicon within the polysilicon layer 300, electron mobility values may be achieved, which are comparable to that within the bulk region of the semiconductor body 100.

The polysilicon layer 300 may thus comprise at least one of a low temperature polysilicon (LTPS) and a continuous grain silicon (SGS).

The length of the electrostatic discharge protection structure 310 between the first terminal 312 and the second terminal 314, respectively, may be in a range of 5 µm to 150 µm or 20 µm to 50 µm. An area of the electrostatic discharge protection structure 310 according to FIGS. 2A and 2B or FIGS. 3 and 8 may be in a range of 100 µm×50 µm×2=10000 $\mu m^2$, by providing a small gate pad length of 100 µm, an electrostatic discharge protection structure 310 on two orthogonal sides (FIG. 2A) or symmetrical on two opposite sides (FIG. 2B) of the gate pad. The area of the electrostatic discharge protection structure 310 may be up to 500 µm×50 µm×2=50000 $\mu m^2$ or up to 2000 µm×50 µm×2=200.000 $\mu m^2$, by providing a large gate pad length of 1000 µm. The area of the electrostatic discharge protection structure 310 does not increase the total chip area, because the diode is constructed between and partially beneath the metal.

An electrostatic discharge protection structure 310 having a diode width in a range between 1000 µm to 2000 µm may be integrated along the gate contact area 510 or furthermore within an edge termination structure of the semiconductor device 10, wherein the semiconductor device 10 may be a superjunction metal oxide semiconductor field effect transistor device or an insulated gate bipolar transistor (IGBT) device. Such an embodiment may be advantageous in case of providing a semiconductor device 10 having a small die area (smaller than 1 $mm^2$), wherein a robustness of the electrostatic discharge protection structure 310 with respect to HBM (Human Body Model) tests may be in a range of 1 kV to 4 kV. Assuming a breakdown current of 1 mA per µm diode width, a robustness of the electrostatic discharge protection structure 310 with respect to HBM (Human Body Model) tests may be in a range of 300 V to 4 kV.

The area of the electrostatic discharge protection structure 310 may be appropriately chosen for dissipating energy caused by an electrostatic discharge event (ESD event) between the first electrode 500 and the second electrode 600.

The first electrode 500 may be electrically coupled to the first terminal 312 of the electrostatic discharge protection structure 310 via a first contact structure 800 and the second electrode 600 may be electrically coupled to the second terminal 314 of the electrostatic discharge protection structure 310 via a second contact structure 900. The heat dissipation structure 700 extends through the second isolation layer 400, wherein the first end 701 is in contact with the electrostatic discharge protection structure 310 and the second end 702 is not in direct electrical contact to any conduction region such as the first electrode 500 or the second electrode 600.

As shown in FIG. 3, the second end 702 is in direct contact to an electrically isolating region, which is formed by the passivation layer 1000 covering the second isolation layer 400. The second end 702 is thus electrically isolated from the first terminal 312 and the second terminal 314 provided that the connection of the second end 702 to the first and second terminals 312, 314 via the first end 701 of the heat dissipation structure 700 and the electrostatic discharge protection structure 310 is not considered. In other words, there is no further conducting path from the second end 702 to the first and second terminals 312, 314 except the conducting path via the first end 701 and the electrostatic discharge protection structure 310. According to an embodiment, the heat dissipation structure 700 may be embedded with an electrically isolating region formed by the second isolation layer 400 and the passivation layer 1000, wherein only the first end 701 of the heat dissipation structure 700 is in direct electrical contact to the electrostatic discharge protection structure 310.

The heat dissipation structure 700 may extend in a lateral direction different to the lateral direction x along the boundary of the first electrode 500 and/or the second electrode 600 (cf. FIGS. 2A and 2B or FIGS. 17 to 19). Both possible arrangements of the heat dissipation structure 700 are illustrated in FIG. 2A. Further rows of the heat dissipation structure 700 may be provided, as can be seen, for example, in FIG. 2A.

The heat dissipation structure 700 may be formed simultaneously with the first and second contact structures 800 and 900 by forming trenches 450, 450a, 450b through the second isolation layer 400 and the polysilicon layer 300, as will be discussed below. The simultaneous formation of the first and second contact structures 800 and 900 together with the heat dissipation structure 700 leads to a beneficial manufacturing process. When forming the first electrode 500 and the second electrode 600 on the second isolation layer 400 to be electrically coupled with the first contact structure 800 and the second contact structure 900, respectively, the bottom side 501 (FIG. 10G) of the first electrode 500 and the bottom side 601 of the second electrode 600 are at a same vertical level as the second end 702 of the heat dissipation structure 700. The second end 702 of the heat dissipation structure 700 may be flush with the top surface 402 of the second isolation layer 400 in case the second isolation layer 400 has a planarized top surface 402.

The electrostatic discharge protection structure 310 embedded between the first isolation layer 200 and the second isolation layer 400 has a high thermal impedance due to the thermal isolation by materials like PSG, TEOS, polyoxide or field oxides. The thickness of the electrostatic discharge protection structure 310 may be in a range of 100 nm to 1000 nm, or in a range of 200 nm to 600 nm, or may be in a range between 200 nm to 500 nm, for example. Due to the small thickness of the electrostatic discharge protection structure 310 in comparison to its lateral dimensions, the transient thermal capacity, i.e. the thermal capacity which may buffer short thermal dissipation peaks, is low, which may lead to a deterioration of the electrostatic discharge protection structure 310 or further damages of the semiconductor device 10.

Due to the provision of the heat dissipation structure 700, the thermal capacity of the electrostatic discharge protection structure 310 is increased. A thickness of the heat dissipation structure 700 along a first lateral direction (extending from the first terminal 312 to the second terminal 314 of the electrostatic discharge protection structure 310) may be in a range of 100 nm to 3000 nm and a thickness of the heat dissipation structure 700 along a vertical direction may be in a range of 1000 nm to 2000 nm or 350 nm to 3500 nm.

Thus, a ratio of a thickness of the heat dissipation structure 700 along a vertical direction and a thickness of the electrostatic discharge protection structure along a vertical direction may be greater than 1, greater than 2, greater than 3, or greater than 10. By providing the heat dissipation structure 700, the effective thickness relevant for the thermal capacity is increased, leading to an improved electrostatic discharge protection structure 310 with enhanced thermal robustness.

As can be seen from FIG. 4, which is a detailed view of a portion of the semiconductor device 10 of FIG. 3, the first outdiffusion region 320 and the second outdiffusion region 322 may be self-aligned to a first lateral side 710 of the first end 701 of the heat dissipation structure 700 and a second lateral side 720 opposite to the first lateral side 710 of the first end 701 of the heat dissipation structure 700.

The first end 701 of the heat dissipation structure 700 is a plane area of the heat dissipation structure 700 facing the boundary surface between the electrostatic discharge protection structure 310 and the second isolation layer 400. The first end 701 is a boundary plane area between the heat dissipation structure 700 and the intermediate region 324 of the second region 318 of the electrostatic discharge protection structure 310. As can be seen from FIG. 4, the first end 701 is a plane area, which is flush to the boundary surface between the electrostatic discharge protection structure 310 or the polysilicon layer 300 and the second isolation layer 400.

As mentioned above, the second region 318 in the electrostatic discharge protection structure 310 is formed by forming a trench penetrating the second isolation layer 400 and the polysilicon layer 300, wherein the trench is filled with a polysilicon or metal material. Thus, the first end 701 is not a boundary surface between regions of different material composition. Rather, the material composition of the intermediate region 324 and the heat dissipation structure 700 may be the same. The heat dissipation structure 700 is in contact with the electrostatic discharge protection structure 310 at its first end 701. The first lateral side 710 and the second lateral side 720 of the first end 701 is located at corners between the heat dissipation structure 700 and the polysilicon layer 300 at a first lateral side and a second lateral side of the heat dissipation structure 700, respectively.

A boundary surface between the intermediate region 324 and the first outdiffusion region 320 is formed by a plane being extended vertically from the first lateral side 710 of the first end 701 of the heat dissipation structure 700. A boundary surface between the intermediate region 324 and the second outdiffusion region 322 is formed by a plane being extended vertically from the second lateral side 720 of the first end 701 of the heat dissipation structure 700. The first and second outdiffusion regions 320, 322 are extended from the intermediate region 324 into the polysilicon layer 300 by a lateral dimension c. The boundary surface between the first/second outdiffusion region 320, 322 and the first region 316 is formed by a pn-junction between the first/second outdiffusion region 320, 322 of a second conductivity type and the first region 316 of a first conductivity type.

The lateral dimension b of the second region 318 is a sum of the lateral dimension a of the heat dissipation structure 700 at its first end 701, i.e. the distance between the first lateral side 710 and the second lateral side 720 of the first end 701, and the lateral dimensions c of the two outdiffusion regions 320, 322.

According to an embodiment, a ratio of the lateral dimension b of the second region 318 and of the lateral dimension a of the heat dissipation structure 700 at the first end 701 of the heat dissipation structure 700 is less than 3.0, or less than 2.0, or less than 1.5, or less than 1.2, or less than 1.1. Due to the manufacturing method of the first and second outdiffusion regions 320, 322, as will be discussed below, the lateral dimension c of the first or second outdiffusion region 320, 322 can be kept at small dimensions, wherein the net dopant gradient at the pn-junction between the first region 316 and the second region 318 can be achieved to be relatively high. According to an embodiment, the lateral dimension b of the second region 318 exceeds the lateral dimension a of the heat dissipation structure 700 at the first end 701 of the heat dissipation structure 700 by less than 2 μm, or by less than 1.5 μm, or by less than 1 μm. Thus, the lateral dimension c of the first and second outdiffusion region 320, 322 may be less than 1 μm, or less than 750 nm, or less than 500 nm.

FIG. 5A is a diagram illustrating a net dopant profile $c_{net}(x)$ along the first lateral direction x within an electrostatic discharge projection structure 310 of a semiconductor device 10 in accordance with an embodiment. The net dopant profile $c_{net}(x)$ is a net dopant profile $c_{net}(x,z)$ in the polysilicon layer 300 being averaged within the vertical direction z.

According to an embodiment, a net dopant concentration $c_{net}(-x_1)$ of the first outdiffusion region 320 at a first lateral distance $x_1$ from a center O of the heat dissipation structure 700 equals a net dopant concentration $c_{net}(x_1)$ of the second outdiffusion region 322 at the first lateral distance $x_1$ in opposite direction from the center O of the heat dissipation structure 700. As can be seen from FIG. 5A, the net dopant profiles of the first and second outdiffusion regions 320, 322 are mirror symmetric in the first lateral direction x with respect to the heat dissipation structure 700. As can be seen from FIG. 5A, the net dopant profile $c_{net}(x)$ declines with increasing distance from the heat dissipation structure 700 (the center O) in a first lateral direction x.

Figure 5B:
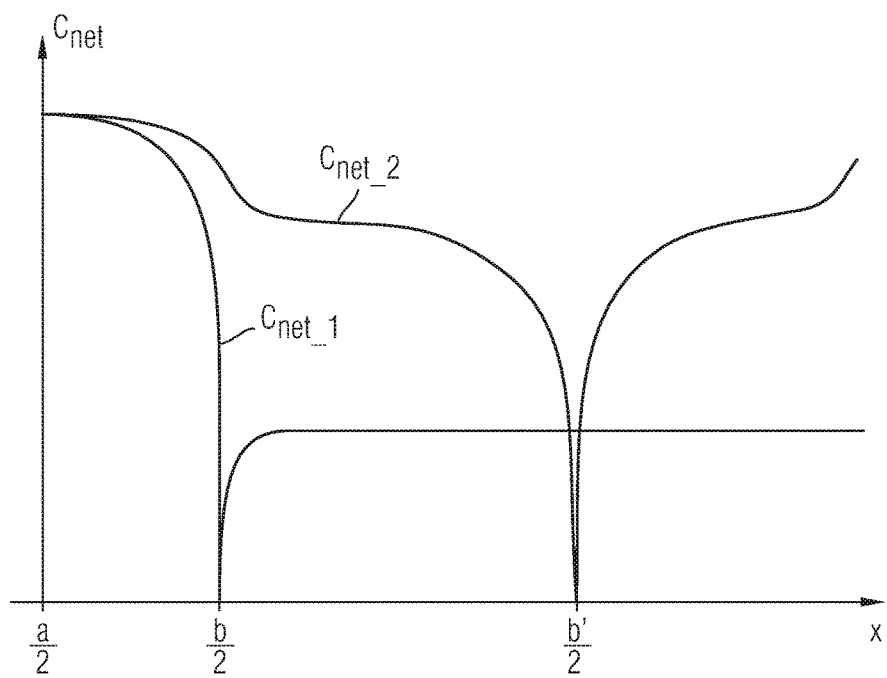
FIG. 5B is a diagram illustrating a first net dopant profile along a first lateral direction within an electrostatic discharge protection structure of a semiconductor device in accordance with an embodiment in comparison to a second net dopant profile along a first lateral direction within an electrostatic discharge protection structure.

FIG. 5B is a diagram illustrating a first net dopant profile $c_{net\_1}(x)$ along a first lateral direction x within an electrostatic discharge protection structure 310 of a semiconductor device 10 in accordance with an embodiment in comparison to a second dopant profile $c_{net\_2}$ along a first lateral direction x within an electrostatic discharge protection structure according to an example. As can be seen from FIG. 5B, the lateral dimension b of a second region 318 having the net dopant profile $c_{net\_1}(x)$ can be formed with significant lower dimensions than the lateral dimension b' of a second region in a polydiode structure having the net dopant profile $c_{net\_2}(x)$. In addition, the net dopant gradient at a pn-junction between a first and a second region 316, 318 is higher in the net dopant profile $c_{net\_1}(x)$ in comparison to the net dopant profile $c_{net\_2}(x)$.

Figure 6A:
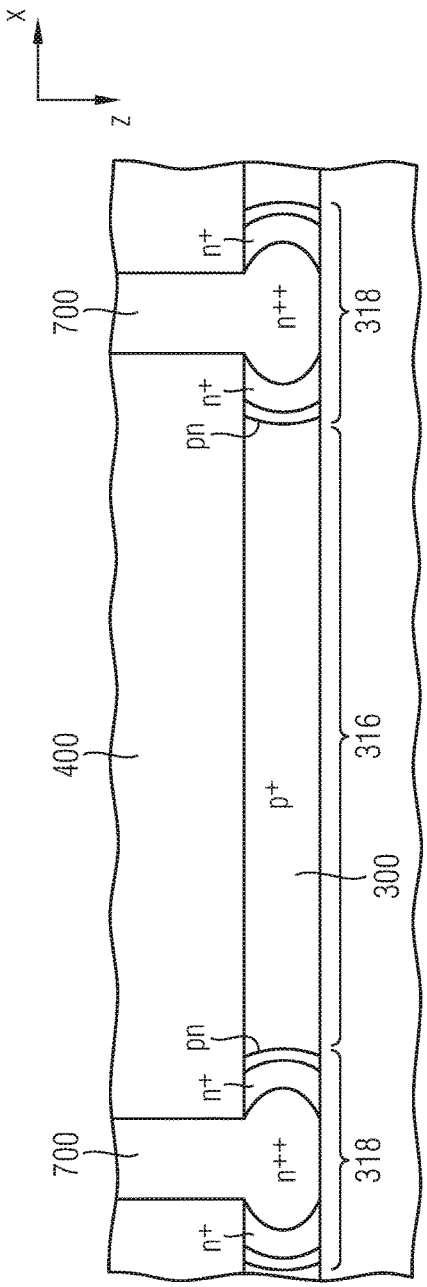
FIG. 6A is a detailed cross-sectional view of a portion of a semiconductor device illustrating the first dopant profile along a first lateral direction within an electrostatic discharge protection structure of a semiconductor device in accordance with an embodiment.
Figure 6B:
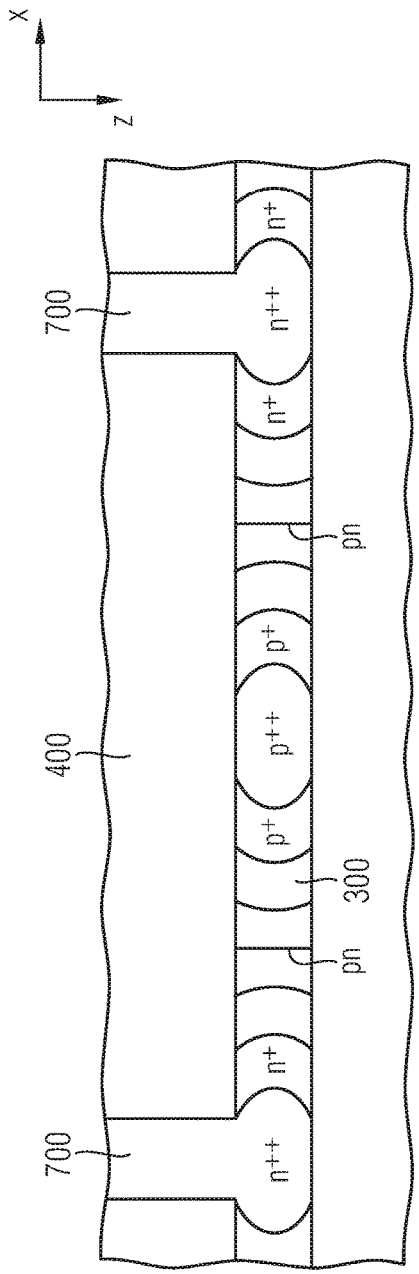
FIG. 6B is a detailed cross-sectional view of a portion of a semiconductor device illustrating the second dopant profile along a first lateral direction within an electrostatic discharge protection structure according to an example.

FIG. 6A is a detailed cross-sectional view of a portion of a semiconductor device 10 illustrating the first net dopant profile $c_{net\_1}(x,z)$ within an electrostatic discharge protection structure 310 of a semiconductor device 10 in accordance with an embodiment. FIG. 6B is a detailed cross-sectional view of a portion of a semiconductor device 10 illustrating the second dopant profile $c_{net\_2}(x,z)$ within an electrostatic discharge protection structure according to an example. The net dopant profiles in FIGS. 6A and 6B are illustrated by equi-concentration lines in the plane spanned by the first lateral direction x and the vertical direction z.

The pn-junctions between a second region 318 and a first region 316 have different structures in the devices as shown in FIGS. 6A and 6B. Depending on diffusion of the dopants in silicon grain, grain boundaries und segregation effects, the diffusion front in x direction may be concave, convex, perpendicular or mixed. As long as the curvature of the resulting pn-junctions has no acute angles, the breakdown behaviour results from an average of the polysilicon grain structure with a symmetry concerning x=0 in FIG. 5A.

The difference between the two illustrated net dopant profiles in FIGS. 6A and 6B results from the different manufacturing processes. In particular, in the structure as shown in FIG. 6A, the polysilicon layer 300 is already doped with dopants of a p-type having a $p^+$-concentration, wherein, after forming trenches in the polysilicon layer 300 and filling the trenches with a polysilicon material of an n-type having an $n^{++}$-concentration, the n-dopants are thermally diffused into the $p^+$-region to form a second region 318 neighbouring a first region 316 of a p-type. In comparison thereto, in the structure of FIG. 6B, an n-type polysilicon layer 300 is doped with a $p^{++}$-dopant in a first region 316. In order to make the structures of FIGS. 6A and 6B comparable, the second region 318 in FIGS. 6A and 6B has been simulated to be formed in a same manner.

Thus, as can be seen from FIG. 5B, FIGS. 6A and 6B, the cathode regions may be significantly reduced in dimension. This results in a reduced collector/emitter-series resistance and in a higher emitter efficiency such that high injection effects only occur at higher breakdown currents.

Figure 7:
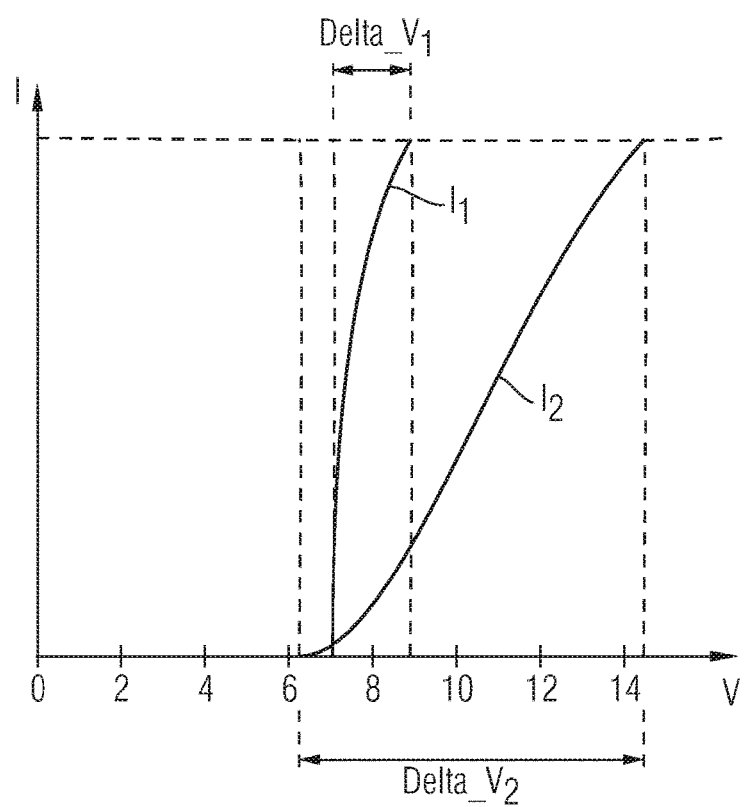
FIG. 7 is a graph illustrating a first I-V-characteristic of an electrostatic discharge protection structure of a semiconductor device in accordance with an embodiment in comparison to a second I-V-characteristic of an electrostatic discharge protection structure of a semiconductor device according to an example.

FIG. 7 is a graph illustrating a first I-V-characteristic $I_1(V)$ of an electrostatic discharge protection structure 310 of a semiconductor device 10 in accordance with an embodiment in comparison to a second I-V-characteristic $I_2(V)$ of an electrostatic discharge protection structure of a semiconductor device in accordance to an example. FIG. 7 shows a simulated diode breakdown current characteristics $I_1(V)$ of an electrostatic discharge protection structure 310 manufactured in accordance with a manufacturing method according to an embodiment in comparison to a simulated diode breakdown current characteristics $I_2(V)$ of an electrostatic discharge protection structure being manufactured by a separate masking process of the first region 316 of a p-type. Compared to the I-V-characteristic $I_2(V)$, the first I-V-characteristic $I_1(V)$ has a four times or five times higher diode current in a breakdown current scenario. This results in a four times higher electrostatic discharge robustness and in a five times smaller electrostatic discharge voltage window, since the differential resistance in that part of the I-V-characteristic is reduced drastically. Due to the self-alignment and the symmetry of the second region 318 within the electrostatic discharge protection structure 310, the electrostatic discharge voltage window is symmetrically in both current directions within the first lateral direction x.

A reduction of the electrostatic discharge voltage window for positive and negative voltages is important for an optimal fitting of the electrostatic discharge protection structure 310 to gate oxide screening tests of a load MOS device having an integrated electrostatic discharge diode. The smaller the variance of the device parameters, the nearer the breakdown voltage of an anti-serial diode chain may be brought to a desired value such as a maximum allowable voltage between gate and source (VGS value). Thus, a small diode reverse current at respective low self-heating of the semiconductor device 10 may be achieved. As can be seen from FIG. 7, the electrostatic discharge voltage window $Delta\_V_1$ of the first I-V-characteristic $I_1(V)$ is five times smaller than the electrostatic discharge voltage window $Delta\_V_2$ of an polydiode chain according to an example.

Figure 8:
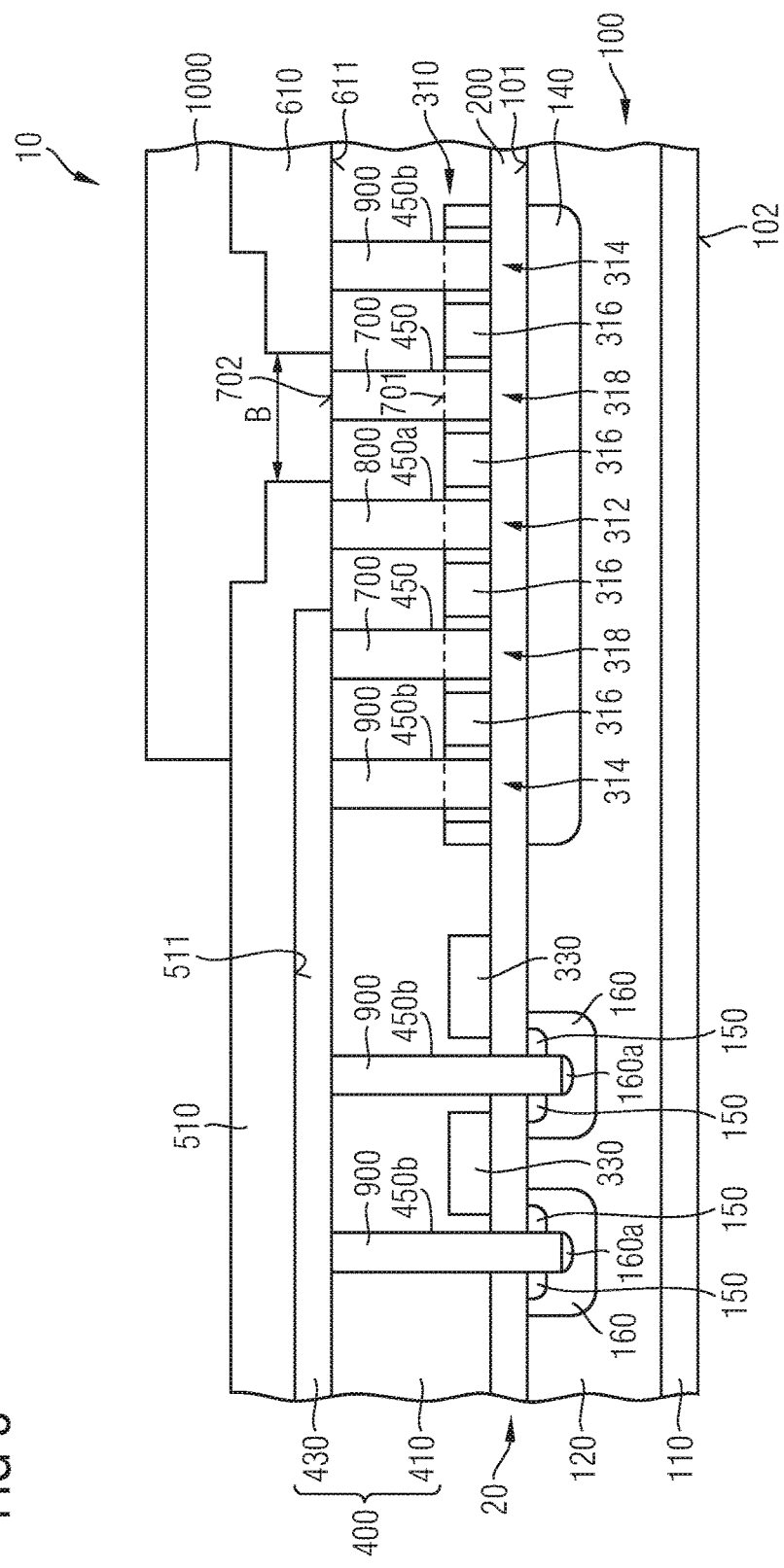
FIG. 8 is a schematic cross-sectional view of a portion of a semiconductor device taken along a section plane A-A' of FIG. 2A or FIG. 2B in accordance with an embodiment.

FIG. 8 is a schematic cross-sectional view of a portion of a semiconductor device 10 taken along a section plane A-A' of FIG. 2A or FIG. 2B in accordance with an embodiment.

As can be seen from FIG. 8, the semiconductor device 10 further comprises the second isolation layer 400 on the electrostatic discharge protection structure 310. The second isolation layer 400 comprises the first dielectric layer 410 as discussed above and further a third dielectric layer 430. The third dielectric layer 430 of the second isolation layer 400 may include at least one of a silicon oxide, a nitride or an oxynitride layer. The thickness of the third dielectric layer 430 of the second isolation layer 400 may be in a range of 40 nm to 1000 nm, or in a range of 100 nm to 300 nm. On the second isolation layer 400, a gate contact area 510 is formed, wherein the gate contact area 510 is electrically coupled to the first terminal 312 of the electrostatic discharge protection structure 310 via the first contact structure 800. The second isolation layer 400 in the semiconductor device 10 of FIG. 8 may also comprise the second dielectric layer 420 as discussed above with regard to FIG. 3.

The semiconductor device 10 of FIG. 8 further comprises a source contact area 610 on the second isolation layer 400, wherein the source contact area 610 is electrically coupled to the second terminal 314 of the electrostatic discharge protection structure 310 via the second contact structure 900. The third dielectric layer 430 is formed between the gate contact area 510 and the second contact structure 900, to electrically isolate the gate contact area 510 from the source contact area 610. The passivation layer 1000 is formed on the second isolation layer 400, the gate contact area 510 and the source contact area 610, wherein the heat dissipation structure 700 of the electrostatic discharge protection structure 310 is formed such that its second end 702 is either in contact with the passivation layer 1000 or the third dielectric layer 430.

As can be seen from FIG. 8, the first isolation layer 200 may be a gate dielectric. The electrostatic discharge protection structure 310 is formed on the first isolation layer 200, which leads to reduced thermal transient impedance due to the enhanced thermal coupling between the electrostatic discharge protection structure 310 and the semiconductor body 100. The gate dielectric may be a silicon oxide having a thickness in a range of 5 nm to 200 nm, or in a range 40 nm to 120 nm. The semiconductor device 10 further comprises transistor cells 20 arranged in an overlap area between the gate contact area 510 and the semiconductor body 100. Each of the transistor cells 20 comprise a gate electrode 330 formed on the first isolation layer 200, source zones 150 being in contact with the first surface 101 of the semiconductor body 100 and extending into the semiconductor body 100, and body zones 160, in which the source zones 150 are embedded. The source zones 150 are of the second conductivity type and the body zones 160 are of the first conductivity type. Furthermore, the drain region 110 of the second conductivity type is provided at the second surface 102 of the semiconductor body 100. The drift region 120 is formed between the drain region 110 and the body zones 160 and is of a second conductivity type. In case of a superjunction device, columns or bubbles of the first conductivity type and the second conductivity type can be implemented both beneath the semiconductor well region 140 and the active transistor cell field. Furthermore, columns or bubbles of the second conductivity type can be overlapping with the semiconductor well region 140.

According to an embodiment, the gate electrodes 330 are formed simultaneously with the electrostatic discharge protection structure 310, and may be part of the polysilicon layer 300. The second contact structure 900 is provided to electrically connect the source contact area 610 with the second terminal 314 of the electrostatic discharge protection structure 310. The second contact structure 900 may be further provided to connect the source contact area 610 with the source zones 150 of the transistor cells 20. According to an embodiment, the first contact structure 800 and the heat dissipation structure 700 may include a same material. In addition, according to an embodiment, the second contact structure 900 and the heat dissipation structure 700 may include a same material. Furthermore, the first contact structure 800, the second contact structure 900 and the heat dissipation structure 700 may include a same material. The first contact structure 800, the second contact structure 900 and the heat dissipation structure 700 may be formed simultaneously, as will be discussed later.

As can be seen from FIG. 8, the electrostatic discharge protection structure 310 may have two second terminals 314 being arranged at opposite sides from the first terminal 312. Thus, the first lateral direction x may be directed to opposite sides, depending on the direction from the first terminal 312 to the second terminal 314. As can be seen from FIG. 8, a bottom side 511 of the gate contact area 510 and/or a bottom side 611 of the source contact area 610 and a top side 702 of the heat dissipation structure 700 may be at a same vertical level, which may result from a specific manufacturing process, as will be discussed below. The semiconductor device 10 thus comprises transistor cells 20 comprising source and body zones 150, 160 in the semiconductor body 100, wherein the source zones 150 are electrically coupled to the source contact area 610 via the second contact structure 900. The second contact structure 900 and the heat dissipation structure 700 may include a same material.

The thickness of the first isolation layer 200 may be in a range between 0.1 µm to 10 µm, or between 0.5 µm to 10 µm, or between 0.5 µm to 5 µm, or between 1 µm and 2.5 µm, or between 1.5 µm and 2 µm in case of a field oxidation process. The thickness of the polysilicon layer 300 may be in a range of 100 nm to 1000 nm, or in a range of 200 nm to 600 nm, or may be in a range between 200 nm to 500 nm. Due to the relatively small vertical dimension of the polysilicon layer 300, the topology of the layer structure may be well-defined. Thus, an improved depth of sharpness region may be achieved at a lithographic process for forming contact holes on active regions and field regions. In order to reach an ESD robustness of 1 to 4 kV, the current density at the diode width as discussed above may be sufficient within the gate pad region and the boundary regions.

When forming the body zones 160 in the area of the transistor cells 20 after forming the polysilicon layer 300, the trench 450 may be lined with a metal layer of, for example titanium, having a thickness in a range between 20 nm to 70 nm and may be processed to form a silicide locally at a bottom region of the trench 450. To prevent a Schottky contact, the trenches 450, 450a, 450b may be formed deep enough such that no silicide in the bottom area of the trenches 450, 450a, 450b may be formed. In case a boron implantation for forming body contact zones 160a at the transistor cells 20 is performed, the implantation may be removed to a grand part by etching the trenches 450, 450a, 450b for the second contact structure 900 into the semiconductor body 100. It is however, also possible to mask the polysilicon layer 300 in case of performing an ion implantation for forming the body contact zones 160a.

In case the polysilicon layer 300 is formed on a first isolation layer 200 being a gate oxide layer, an etch stop layer may be deposited below the polysilicon layer 300, which comprises an oxide or a nitride material. By providing an etch stop layer between the polysilicon layer 300 and the first isolation layer 200 it can be prevented that the first isolation layer 200 being a relatively thin gate oxide is thinned within etching the trench 450 penetrating the polysilicon layer 300 and further penetrating into the first isolation layer 200. In case of providing a trench penetrating into the semiconductor body 100 (which is filled with the second contact structure 900), the same penetration depth in the polysilicon layer 300 may be achieved.

According to an embodiment, the polysilicon plugs of heat dissipation structure 700 being, for example of an $n^+$-type serve as a self-aligned dopant source and the first and second contact structures 800, 900 for an anti-serial diode structure acting as an electrostatic discharge protection structure 310. Thus, the at least one second region 318 as well as the first and second contact structure 800, 900 are self-aligned to each other, leading to a reduction of electric parameter variants and in particular to a bidirectional width of the electrostatic discharge voltage window at low differential series resistance. The integration of an electrostatic discharge protection structure 310 in a solid-state switch as discussed above may lead to cost reductions of about 50%.

Although no multilayer metallization structure is shown, the electrostatic discharge protection structure 310 as described above may be used in discrete semiconductor devices or integrated circuits with multilayer wiring systems, when using polysilicon plugs.

Figure 9:
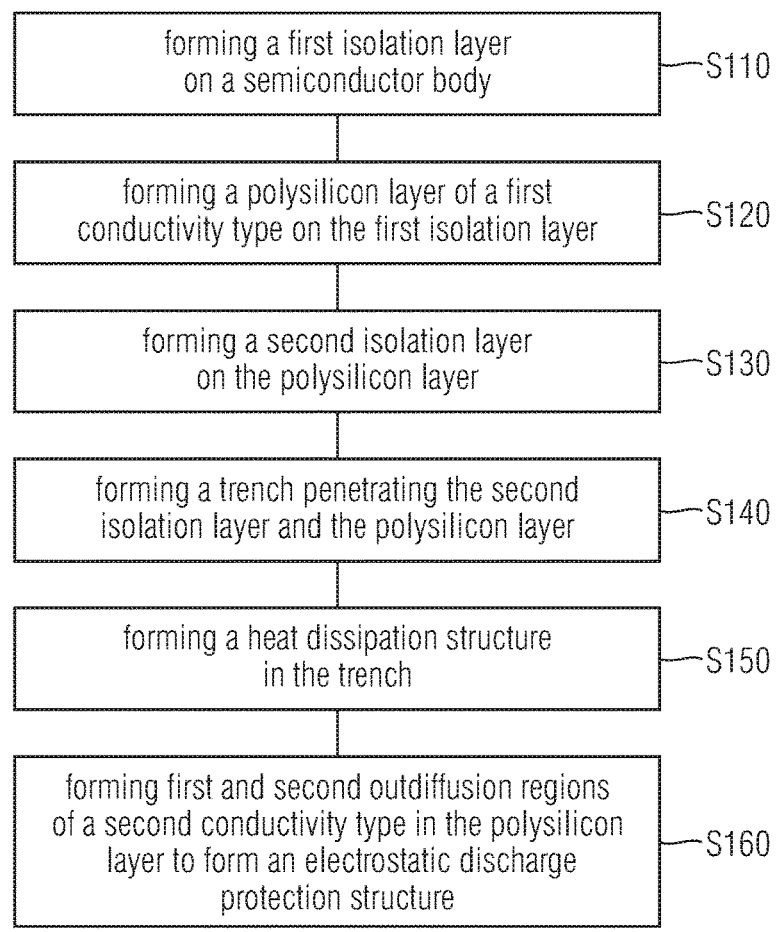
FIG. 9 illustrates a schematic process chart of a method of manufacturing a semiconductor device in accordance with an embodiment.

FIG. 9 illustrates a schematic process charge of a method of manufacturing a semiconductor device 10 in accordance with an embodiment.

Process feature S110 includes forming a first isolation layer on a semiconductor body.

Process feature S120 includes forming a polysilicon layer of a first conductivity type on the first isolation layer.

Process feature S130 includes forming a second isolation layer on the polysilicon layer.

Process feature S140 includes forming a trench penetrating the second isolation layer and the polysilicon layer.

Process feature S150 includes forming a heat dissipation structure in the trench.

Process feature S160 includes forming first and second outdiffusion regions of a second conductivity type in the polysilicon layer to form a self-aligned electrostatic discharge protection structure.

In FIGS. 10A to 10G, a method of manufacturing the semiconductor device 10 according to an embodiment will be described with reference to cross-sectional views for illustration of selected processes.

Figure 10B:
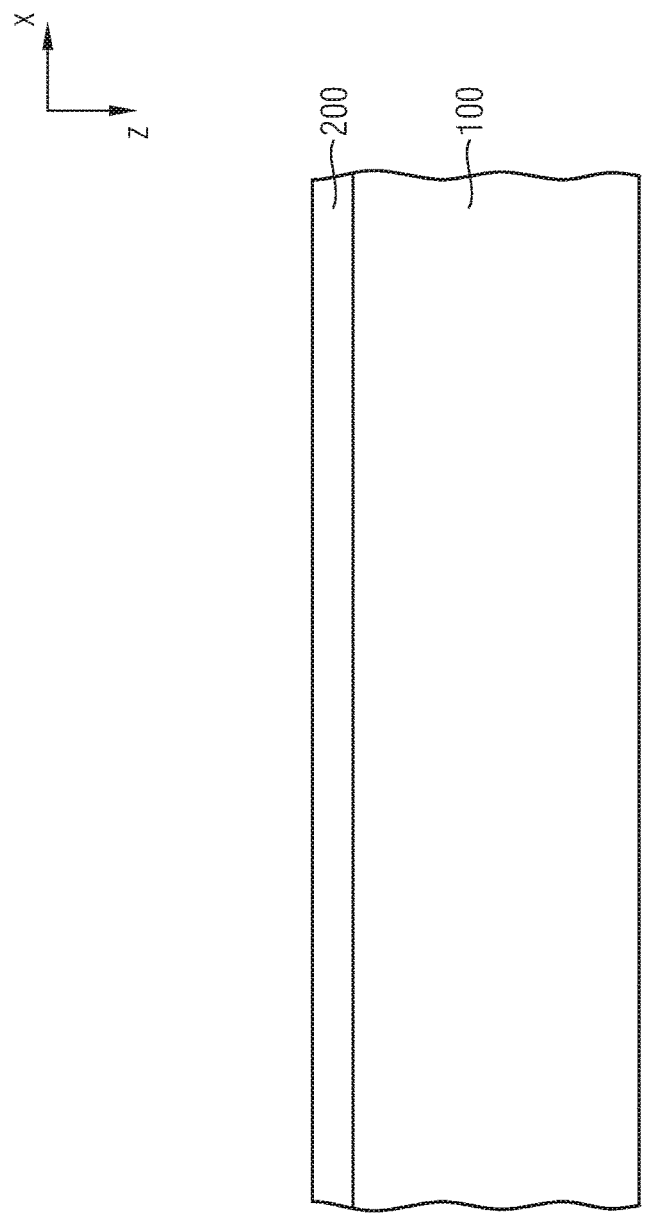

In FIG. 10A, a semiconductor body 100, as described above, is provided. As shown in FIG. 10B, the first isolation layer 200 such as a silicon oxide layer is formed on the semiconductor body 100. The oxide layer of the first isolation layer 200 may be formed by a field oxidation or deposition process or may be formed as a gate oxide layer.

Figure 10C:
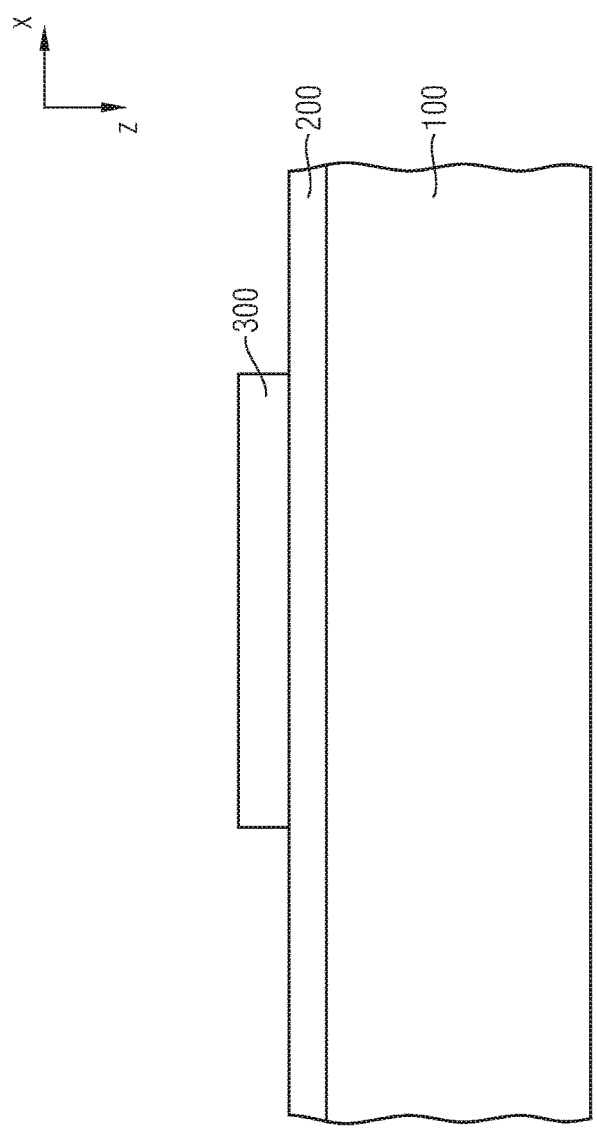

As shown in FIG. 10C, a polysilicon layer 300 of a first conductivity type is formed on the first isolation layer 200. The polysilicon layer 300 may be patterned to have a structure within the lateral plane as shown in FIG. 2A or FIG. 2B (cf. the structures in FIGS. 2A and 2B defined by the dashed lines). The thickness of the polysilicon layer 300 in a vertical direction z may be in a range of 100 nm to 1000 nm, or 200 nm to 600 nm, or 200 nm to 500 nm. The thickness of the polysilicon layer 300 may be limited by the penetration depth of the dopants of the first conductivity type in an ion implantation and diffusion process.

According to an embodiment, boron ions may be used to dope the undoped or weakly n doped polysilicon layer 300 in an ion implantation process. The polysilicon layer 300 may also be of second conductivity type with a lower doping concentration and can be overcompensated by implantation of, for example the body implant, into the first conductivity type.

In case of using boron ions as dopants, the diode parameters of the electrostatic discharge protection structure 310 formed in the polysilicon layer 300 may be fine-tuned. However, according to another embodiment, phosphor ions may be used for doping the polysilicon layer 300 in an ion implantation process. The net dopant concentration of the polysilicon layer 300 of the first conductivity type may be in a range of $5\times10^{16}$ cm$^{-3}$ to $5\times10^{19}$ cm$^{-3}$, or in a range of $5\times10^{16}$ cm$^{-3}$ to $5\times10^{18}$ cm$^{-3}$, or in a range of $1\times10^{17}$ cm$^{-3}$ to $1\times10^{19}$ cm$^{-3}$.

According to an embodiment, the polysilicon layer 300 may be of a p-type. In case the first isolation layer 200 is formed in a field oxidation process, the first isolation layer 200 may be removed within an area comprising transistor cells 20 to form a gate oxide acting as the first isolation layer 200 in the transistor cell area. The thickness of the gate oxide in a vertical direction z may be in a range of 5 nm to 200 nm, or 70 nm to 90 nm or 40 nm to 120 nm. After forming a gate oxide on the semiconductor body 100, a polysilicon layer may be formed on the first isolation layer 200 having a second conductivity type, which is patterned to form a gate electrode layer 330 as shown in FIG. 8.

An ion implantation of dopants of a first conductivity type to form the body zones 160 within the semiconductor body 100 may be combined with an ion implantation of dopants of the first conductivity type within the polysilicon layer 300. Thus, the body zones 160 and the doping of the polysilicon layer 300 with dopants of a first conductivity type may be formed in one process. According to another embodiment, the polysilicon layer 300 may have a net dopant concentration of a first conductivity type or second conductivity type, which is below a net dopant concentration of $1\times10^{17}$ cm$^{-3}$, or may further be an undoped polysilicon layer 300, wherein the final net dopant concentration of the polysilicon layer 300 of the first conductivity type can be set in the sequent implantation step of the body zones 160. As can be further seen from FIG. 8, source zones 150 and body contact zones 160a are formed in the semiconductor body 100.

Figure 10D:
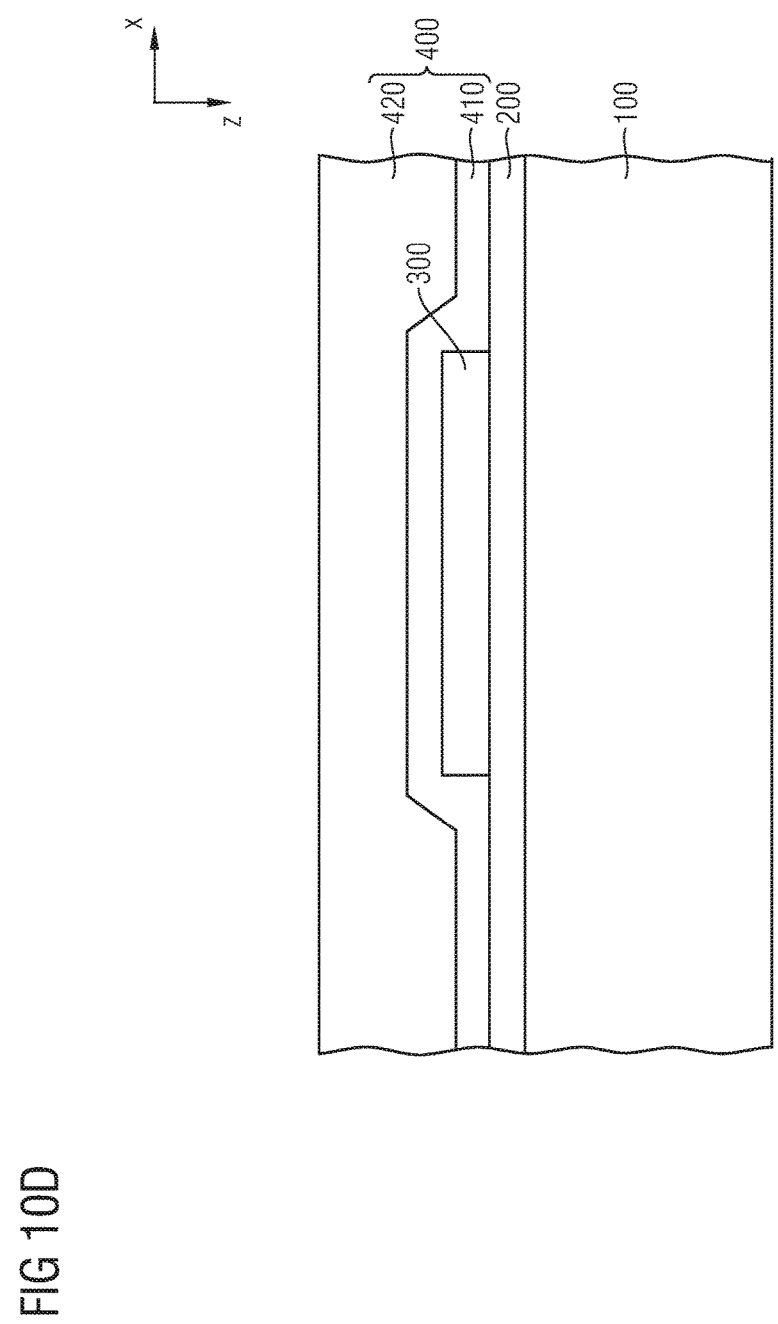

As can be seen from FIG. 10D, the second isolation layer 400 is formed on the polysilicon layer 300. As discussed above, the second isolation layer 400 may comprise a first dielectric layer 410 and a second dielectric layer 420, wherein the first dielectric layer 410 may comprise an USG layer having a thickness in a vertical direction z in a range between 50 nm to 500 nm, or 200 nm to 400 nm. The second dielectric layer 420 may comprise a BPSG-layer having a thickness in a range of 200 nm to 2000 nm, or 1100 nm to 1300 nm. The first and second dielectric layer 410, 420 may further comprise the materials or have a structure as discussed above.

Figure 10E:
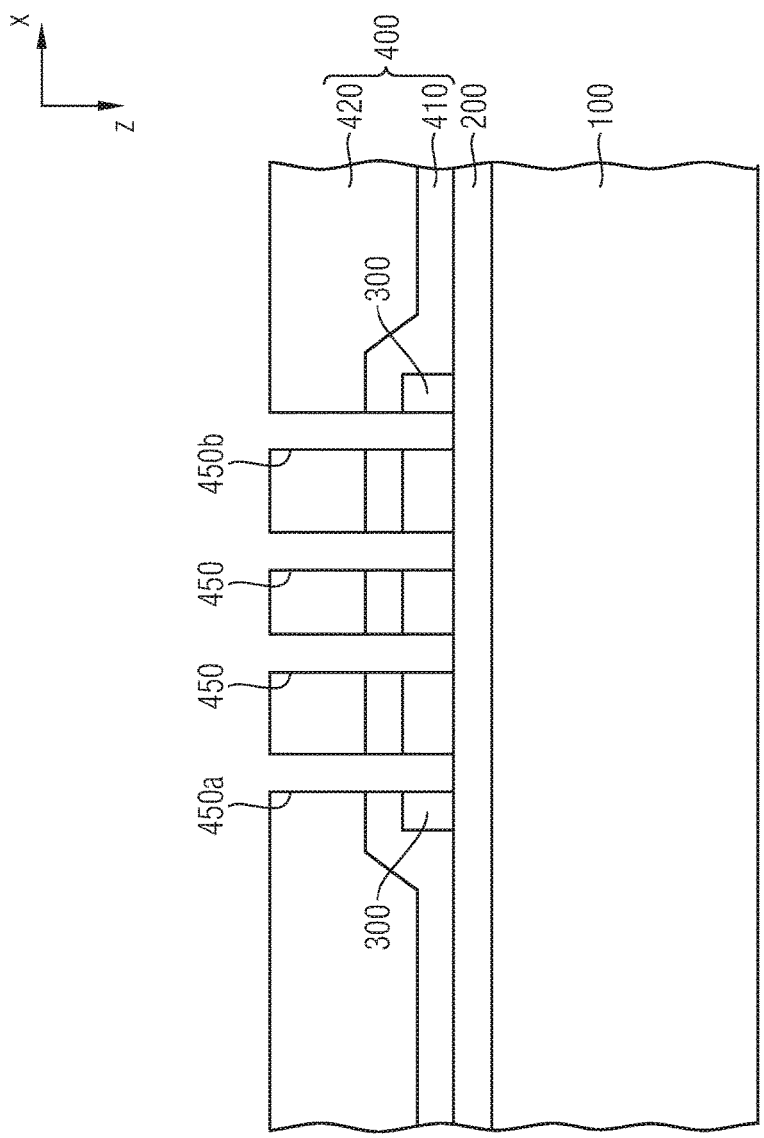

In FIG. 10E, a trench 450 penetrating the second isolation layer 400 and the polysilicon layer 300 is formed. The trench 450 may extend up to a distance of 300 nm into the polysilicon layer 300. The trench 450 fully penetrates the polysilicon layer 300 to ensure that the polysilicon layer 300 acts as a polydiode structure, as will be discussed below. There may be more than one trench 450 provided to be filled with a respective heat dissipation structure 700. Thus, the heat dissipation structure 700 may be provided multiple times and may be sequentially aligned in equidistant spacing from each other. The multiple heat dissipation structures 700 as shown, for example in FIG. 8, may be arranged in an isolation region comprising the first isolation layer 200, the second isolation layer 400 and the passivation layer 1000 and form a polydiode structure of diodes being connected in an anti-serial cascade within the polysilicon layer 300. Such a structure cannot be achieved with a common power metallization layer (having, for example, a thickness of 5 μm) due to common design rules. Thus, a fine structure of pn-junctions having lateral dimensions in a range of 1 μm to 10 μm, or in a range between 4 μm to 5 μm can be manufactured with a common power metallization.

The trench 450 to be filled with the heat dissipation structure 700 may be formed at the same time with a trench 450a to be filled with the first contact structure 800 and a trench 450b to be filled with the second contact structure 900. As can be seen from FIG. 8, the trench 450 to be filled with the heat dissipation structure 700 may be formed at the same time together with the trench 450b to be filled with the second contact structure 900 to contact the source zones 150 and the body zone 160 (via the body contact zone 160a). Herein, the trench 450b to be filled with the second contact structure 900 may extend up to 300 nm into the semiconductor body 100.

Figure 10F:
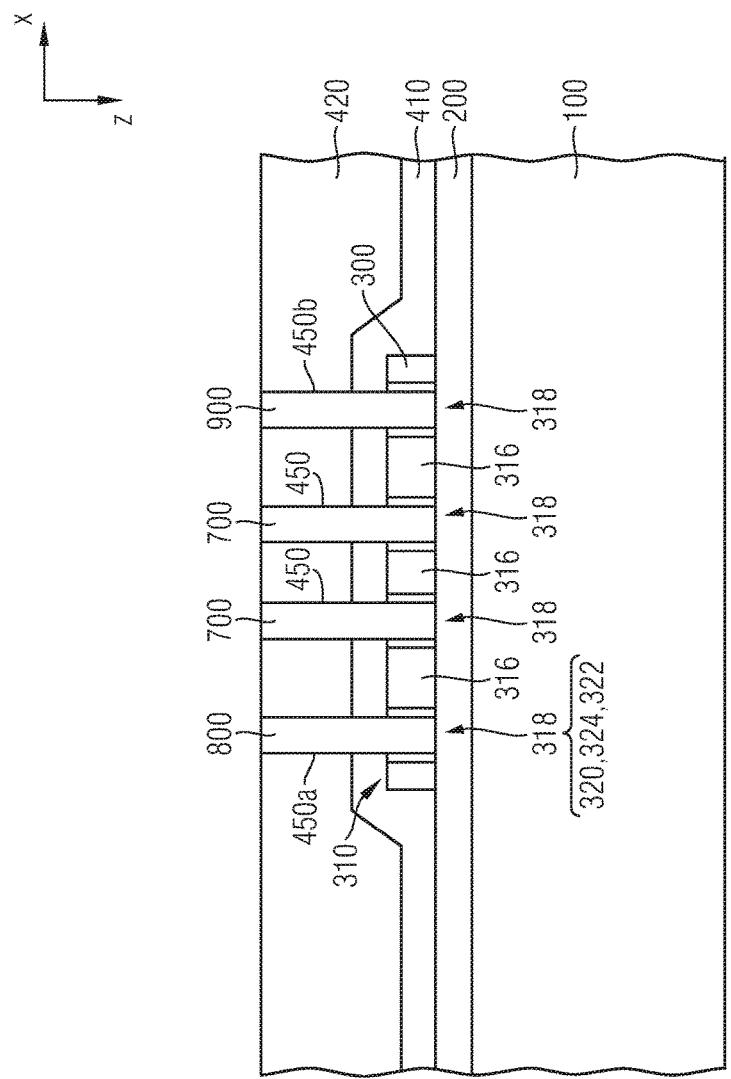

As can be seen from FIG. 10F, the heat dissipation structure 700 is formed in the trench 450, wherein further first and second outdiffusion regions 320, 322 of a second conductivity type are formed in the polysilicon layer 300, to form an electrostatic discharge protection structure 310.

Exemplary embodiments for forming the heat dissipation structure 700 and the electrostatic discharge protection structure 310 will be discussed below with regard to FIGS. 11A to 11C, FIGS. 12A to 12C, and FIGS. 13A to 13D.

Figure 10G:
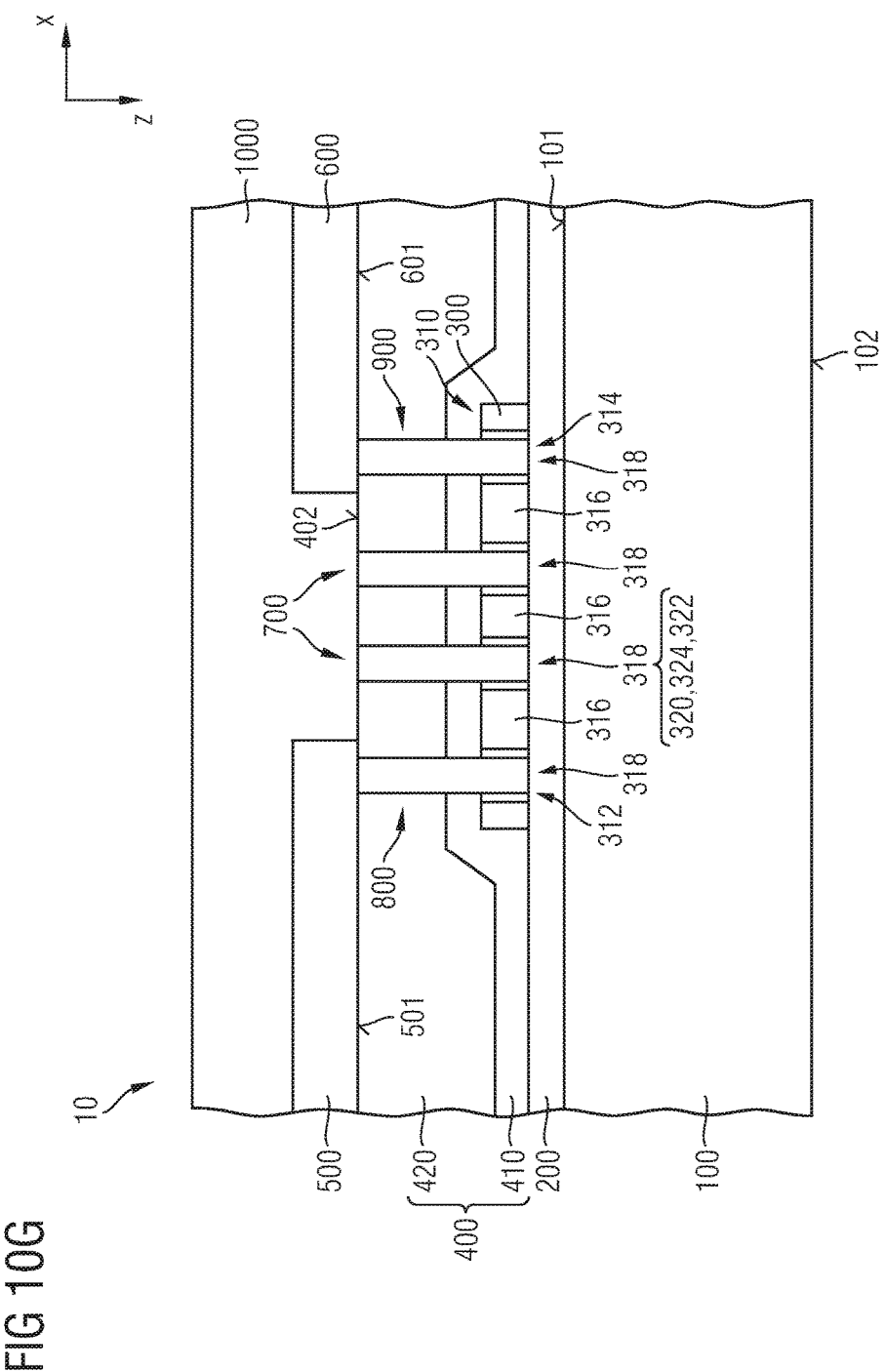

As can be seen from FIGS. 10F and 10G, the first contact structure 800, the second contact structure 900 and the heat dissipation structure 700 may be formed by the following process. Firstly, the trenches 450, 450a and 450b are formed within the second isolation layer 400 and the polysilicon layer 300, e.g. by an anisotropic etching process. Thereafter, an electrically and thermally conductive material may be deposited on the second isolation layer 400 to fill the trenches 450, 450a, 450b with an electrically and thermally conductive material. The electrically and thermally conductive material on the top surface 402 of the second isolation layer 400 may be removed by a planarization process, e.g. a chemical mechanical polishing (CMP) process. By this process, a planarized top surface 402 of the second isolation layer 400 may be formed, with first and second contact structures 800, 900 and the heat dissipation structure 700. The second end 702 of the heat dissipation structure 700 may be in direct contact with the passivation layer 1000 covering the first electrode 500, the second isolation layer 400 and the second electrode 600.

In the following, two embodiments of forming the heat dissipation structure 700 and the electrostatic discharge protection structure 310 will be discussed.

Figure 11A:
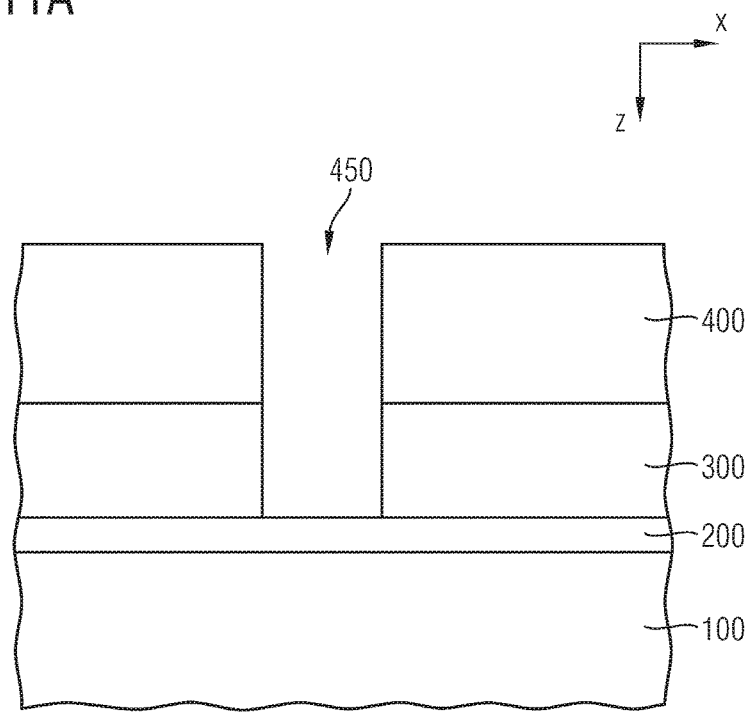
FIGS. 11A to 11C are cross-sectional views illustrating a method of forming a heat dissipation structure and first and second outdiffusion regions in accordance with an embodiment.
Figure 11B:
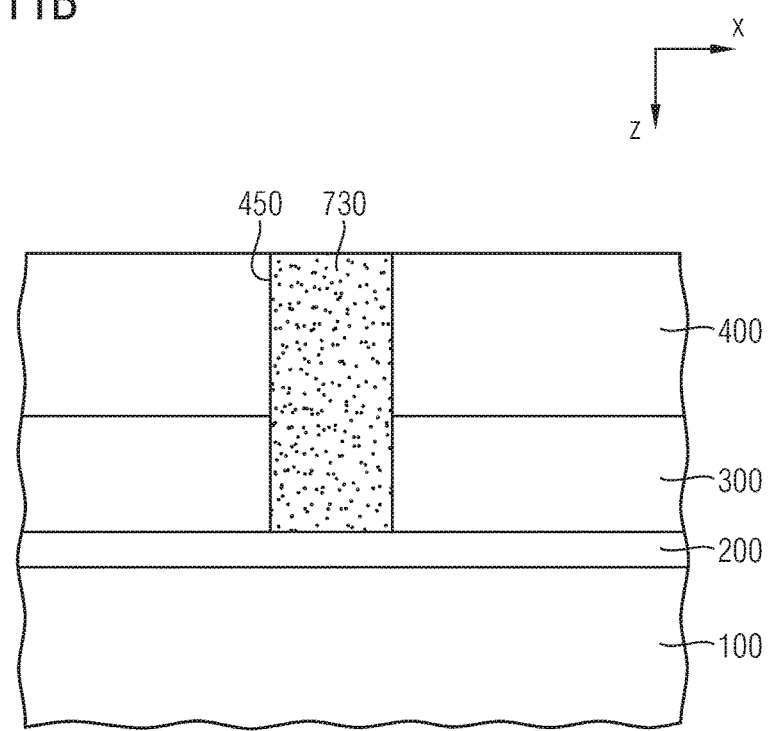
Figure 11C:
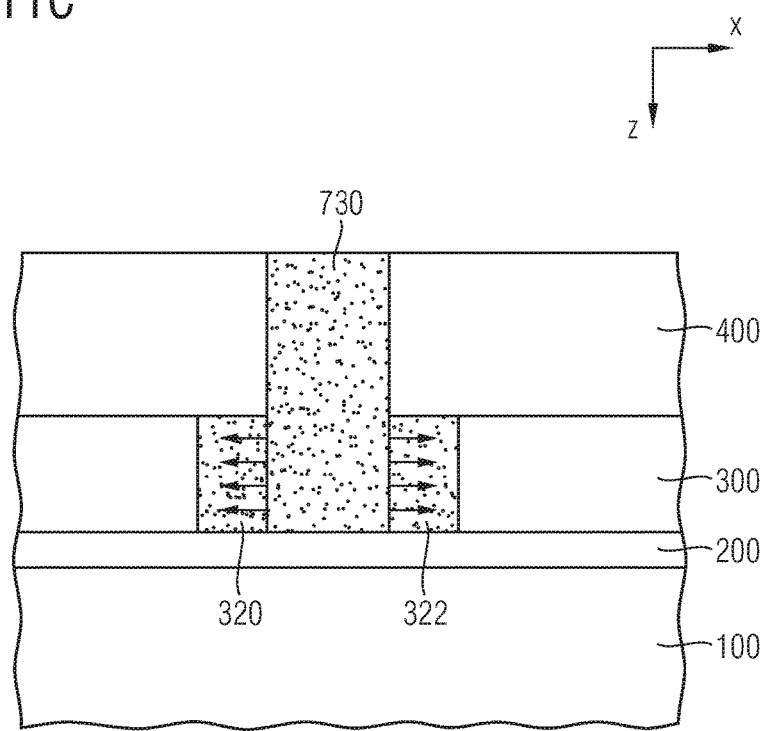

FIGS. 11A to 11C are cross-sectional views illustrating a method of forming a heat dissipation structure 700 and first and second outdiffusion regions 320, 322 in accordance with an embodiment.

As shown in FIG. 11A, the trench 450 is formed in the second isolation layer 400 and the polysilicon layer 300, wherein the trench 450 fully penetrates the polysilicon layer 300 and the second isolation layer 400. Herein, the first isolation layer 200 may be used an etch stop layer. The trench 450 may be formed by an appropriate process, e.g. dry and/or wet etching. As an example, the trench 450 may be formed by an anisotropic plasma etch process, e.g. reactive ion etching (RIE) using an appropriate etch gas, e.g. at least one of $Cl_2$, $Br_2$, $CCl_4$, $CHCl_3$, $CHBr_3$, $BCl_3$, HBr. According to an embodiment, trench sidewalls 451 of the trench 450 may be slightly tapered, e.g. including a taper angle between 88° and 90°. Slightly tapered trench sidewalls 451 may be beneficial with regard to avoiding trench cavities when filling up trenches.

As can be seen from FIG. 11B, the trench 450 is filled with a polysilicon material 730 of a second conductivity type to form the heat dissipation structure 700. The polysilicon material 730 may be of an n-type in case the polysilicon layer 300 is of a p-type. According to an embodiment, the net dopant concentration in the polysilicon material 730 is of such a magnitude that the polysilicon material 730 may be used as a transient infinite dopant source. The net dopant concentration of the second conductivity type in the polysilicon material 730 may be higher than $1\times10^{19}$ $cm^{-3}$, or higher than $5\times10^{19}$ $cm^{-3}$, or higher than $1\times10^{20}$ $cm^{-3}$. The net dopant concentration of the second conductivity type in the polysilicon material 730 may be lower than $5\times10^{20}$ $cm^{-3}$. According to an embodiment, the n+-doped polysilicon material 730 may be doped with phosphor.

At a thickness in the first lateral direction x of the trench 450 being in a range of 300 nm to 1500 nm, or in a range of 500 nm to 1200 nm, or in a range of 500 nm to 1000 nm, at a vertical dimension of the trench 450 being in a range of 1000 nm to 2500 nm, or in a range of 1500 nm to 2000 nm, or in a range of 1750 nm to 1850 nm, and at annealing processes having a relatively low temperature budget. In particular, annealing processes may be performed for activating the source/body contacts and the dopants within the polysilicon material 730, the polysilicon material 730 can be regarded as a transient infinite dopant source. The annealing processes may be performed at temperatures between 900° C. to 975° C. and at annealing periods of 30 second to 5 minutes, or 30 seconds to 100 minutes. Alternatively, rapid thermal annealing (RTP) process steps can be performed at temperatures up to 1100° C. and several seconds annealing time.

As can be seen from FIG. 11C, the annealing and activation step leads to a thermally induced diffusion of dopants of the second conductivity type from the heat dissipation structure 700 (or from the polysilicon material 730) into the polysilicon layer 300 to form the first and second outdiffusion regions 320, 322. Due to the specific annealing and activation step as shown in FIG. 11C, the first and second outdiffusion regions 320, 322 may be provided with a relatively short lateral dimension, i.e. having a lateral dimension being in a range between 100 nm to 700 nm, or in a range of 200 nm to 500 nm. At the same time, the first and second outdiffusion regions 320, 322 have a relatively high net dopant concentration (in a range between $1\times10^{19}$ $cm^{-3}$ to $1\times10^{20}$ $cm^{-3}$) combined with a high net dopant profile gradient at the pn-junction between the polysilicon layer 300 of the first conductivity type and the first or second outdiffusion region 320, 322 of the second conductivity type. The high gradient at the pn-junction between the second region 318 (including the first and second outdiffusion regions 320, 322) and the first region 316 (including the polysilicon layer 300 of the first conductivity type remaining after forming the first and second outdiffusion regions 320, 322) has already been discussed with regard to FIGS. 5A and 5B, in particular at the pn-junction at a lateral dimension b/2 from the center point O. Due to the high gradient of the pn-junction within the first and second region 316, 318, a relatively low emitter/collector-series resistance may be achieved.

Figure 12A:
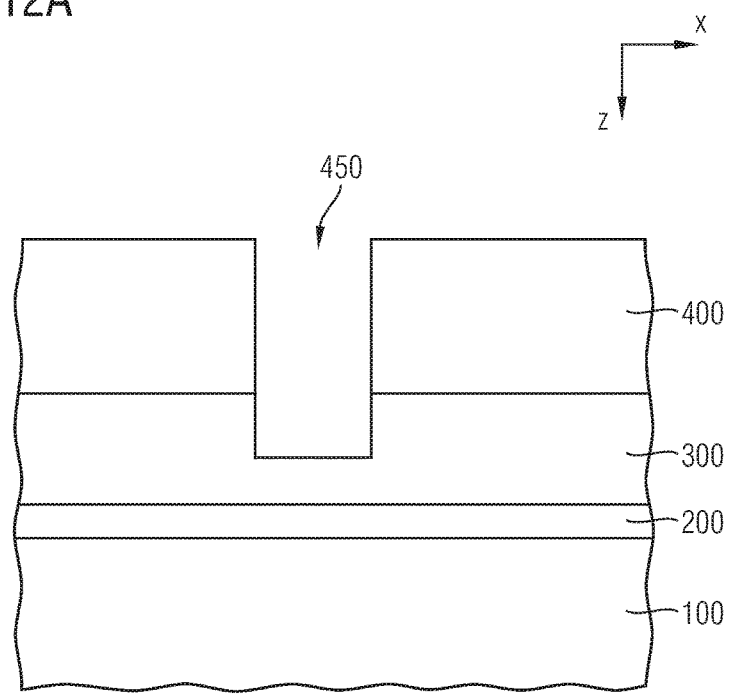
FIGS. 12A to 12C are cross-sectional views illustrating a method of forming a heat dissipation structure and first and second outdiffusion regions in accordance with another embodiment.
Figure 12B:
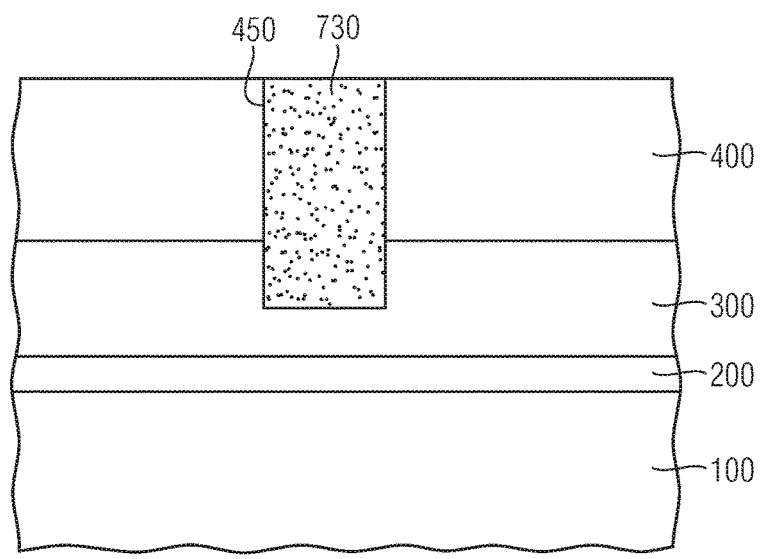
Figure 12C:
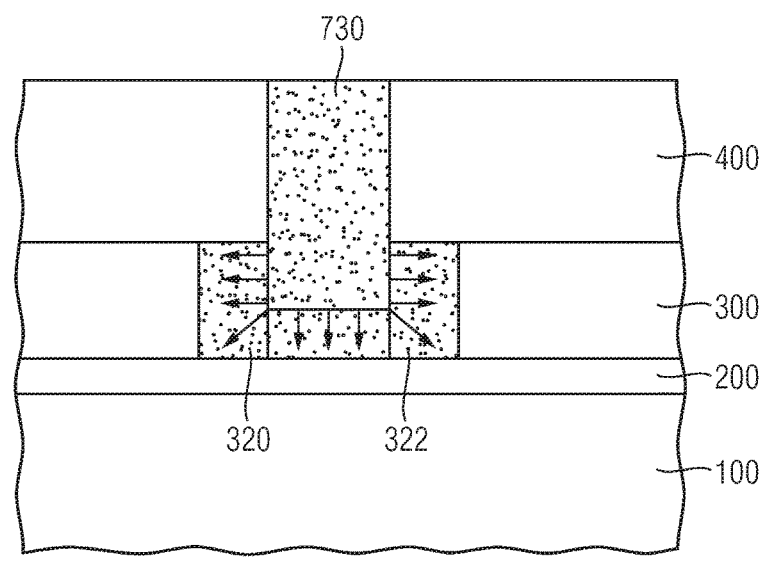

FIGS. 12A to 12C are cross-sectional views illustrating a method of forming a heat dissipation structure 700 and first and second outdiffusion regions 320, 322 in accordance with another embodiment. The process steps as shown in FIGS. 12A to 12C are basically the same steps as shown in FIGS. 11A to 11C, subject to forming the trench 450 within the polysilicon layer 300, which not fully penetrates the polysilicon layer 300. The dimension of the trench 450 in a vertical direction z may be in a range of 50% to 90% of the dimension of the polysilicon layer 300 in the vertical direction z. As can be seen from FIGS. 12B and 12C, the annealing and activation step leads to a thermally induced diffusion of dopants of the second conductivity type from the heat dissipation structure 700 (or from the polysilicon material 730) into the polysilicon layer 300 to form the first and second outdiffusion regions 320, 322. Herein, the diffusion of dopants into the polysilicon layer occurs not only mainly along the first lateral direction x, but also along a vertical direction z. Due to the diffusion of dopants of the second conductivity type from the bottom area of the trench 450 into the polysilicon layer 300 located below the trench 450, a complete penetration of the intermediate region 324 with dopants of the second conductivity type can be achieved, leading to a polydiode structure in the polysilicon layer 300. When processing the trench 450 together with trenches in the active area, for example an active transistor cell area, silicide processes and/or contact implants applied to the trenches in the active area may be masked with respect to the trench 450, for example.

FIGS. 13A to 13D are cross-sectional views illustrating a method of forming a heat dissipation structure 700 and first and second outdiffusion regions 320, 322 in accordance with still another embodiment.

Figure 13A:
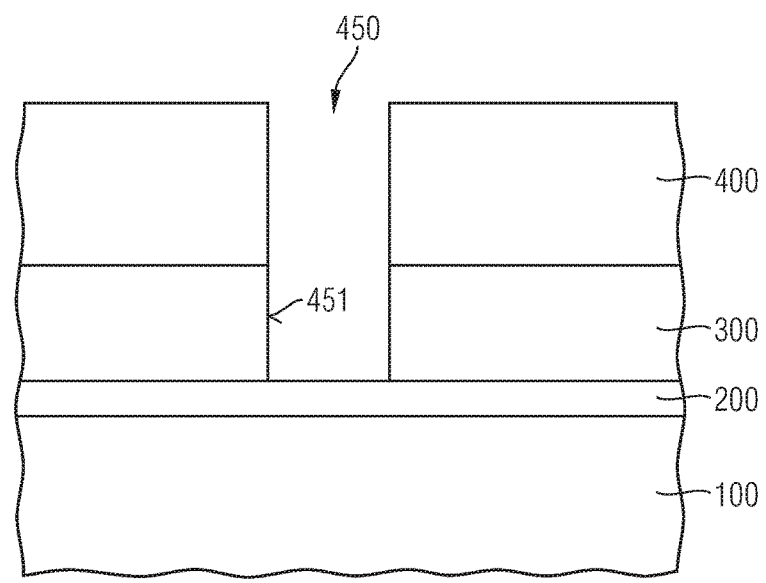
FIGS. 13A to 13D are cross-sectional views illustrating a method of forming a heat dissipation structure and first and second outdiffusion regions in accordance with still another embodiment.

FIG. 13A illustrates the process step of forming a trench 450 penetrating the second isolation layer 400 and the polysilicon layer 300, as already discussed above with regard to FIG. 11A. It shall be emphasized that the following process steps illustrated in FIG. 13B to 13D may also be performed when starting with a structure as shown in FIG. 12A, in which a trench 450 is formed within the polysilicon layer 300, which not fully penetrates the polysilicon layer 300.

Figure 13B:
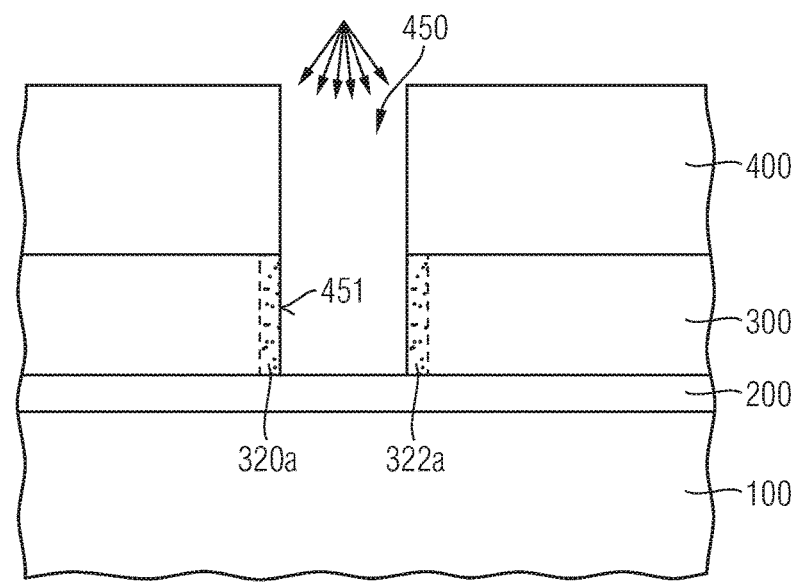

As shown in FIG. 13B, after forming the trench 450, a part 320a, 322a of the polysilicon layer is doped via trench sidewalls 451 of the trench 450 by dopants of a second conductivity type.

According to an embodiment, dopants of a second conductivity type may be introduced uniformly in the polysilicon layer 300 via the trench sidewalls 451 of the at least one trench 450 by a plasma doping process. Plasma doping of the part of the polysilicon layer 300 via trench sidewalls 451 of the trench 450 allows high dose implants at low energies and is also known as PLAD (plasma doping) or PIII (plasma immersion ion implantation).

These methods allow for a precise doping of the part of the polysilicon layer 300 at the trench sidewalls 451. A conformal doping of the part of the polysilicon layer 300 at the trench sidewalls 451 can be achieved by applying a voltage to a substrate surrounded by a radio frequency (RF)

plasma including a dopant gas. Collisions between ions and neutral atoms as well as the biasing of the semiconductor body 100 lead to a broad annular distribution of the dopants allowing for a homogeneous doping over the trench sidewalls 451. Also a small vertical gradient in dose of doping in the part of the polysilicon layer 300 may be achieved by plasma doping. This allows for a vertical variation of a degree of charge compensation improving stability of manufacture and/or avalanche robustness. A vertical variation of dose of doping may be smaller 20%, or smaller than 10% or smaller than 5%.

When doping with PLAD, the semiconductor body 100 having the trench 450 is exposed to a plasma including ions of dopants. These ions are accelerated by an electric field towards the semiconductor body 100 and are implanted into an exposed surface of the polysilicon layer 300. An implanted dose can be adjusted or controlled via DC voltage pulses, e.g. negative voltage pulses. A Faraday system allows to adjust or control the dose. Two sets of coils, i.e. a horizontal coil and a vertical coil allow to generate the plasma and keep it homogeneous. An ion density can be adjusted via a distance between the coils and the substrate. Interaction between the vertical coils and the horizontal coils allows to adjust or control homogeneity and the ion density.

A penetration depth of the dopants into the polysilicon layer 300 and the implant dose may be adjusted via a pulsed DC voltage applied between the semiconductor body 100 and a shield ring surrounding it.

According to an embodiment, doping the part of the polysilicon layer 300 by plasma doping includes introducing the dopants into the part of the polysilicon layer 300 via the trench sidewalls 451 at a dose in a range of $5 \times 10^{11}$ cm$^{-2}$ to $3 \times 10^{13}$ cm$^{-2}$, or in a range of $1 \times 10^{12}$ cm$^{-2}$ to $2 \times 10^{13}$ cm$^{-2}$. This comparatively low dose requires modifications of the pulsed DC voltage typically used. Typically doses exceeding $10^{15}$ cm$^{-2}$ are implanted by these techniques. According to an embodiment, a pulse distance of the DC voltage pulses is adjusted in a range of 100 µs to 10 ms, in particular between 500 µs and 5 ms. A DC voltage pulse rise time is set to a value smaller than 0.1 ps, for example. According to an embodiment a pulse width ranges between 0.5 µs to 20 µs, or between 1 µs to 10 µs.

Figure 13C:
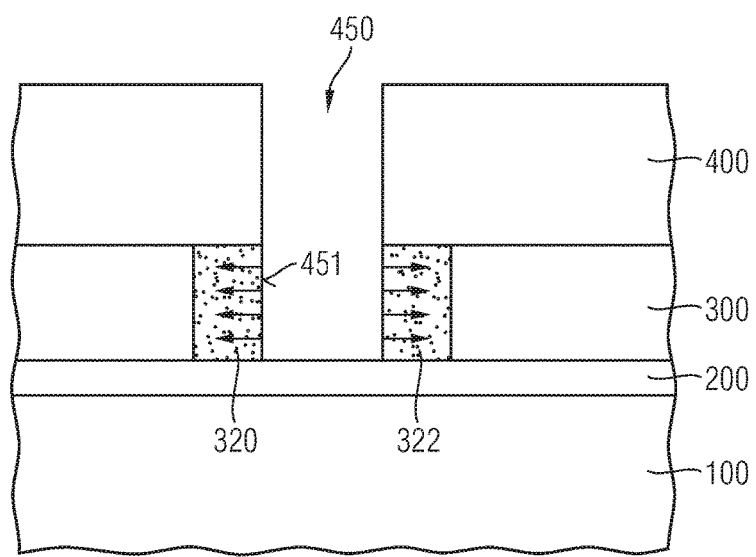

Thereafter, as shown in FIG. 13C, the dopants of the second conductivity type are thermally induced diffused from the trench sidewalls 451 into the polysilicon layer 300, to form the first and second outdiffusion regions 320, 322.

Figure 13D:
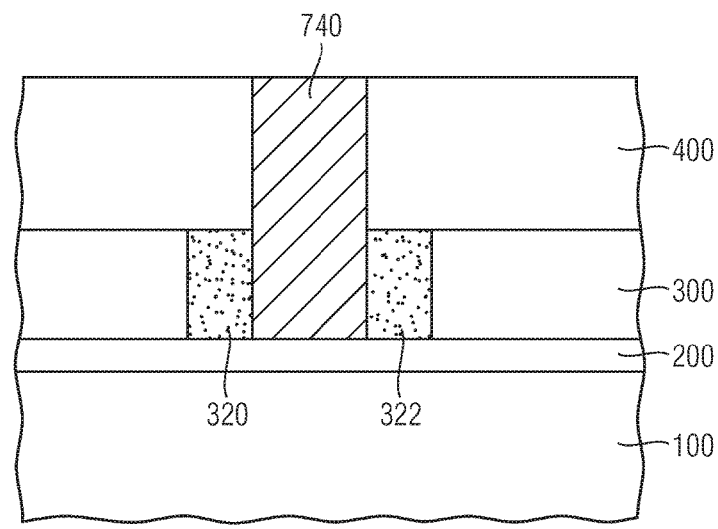

As shown in FIG. 13D, the trench 450 may be filled with a conductive material 740 to form the heat dissipation structure. The conductive material 740 may be a metal. The conductive material 740 is a material having a thermal and electric conductivity, to ensure electric conductance within the polysilicon layer 300 between the first outdiffusion region 320 and the second outdiffusion region 322. The conductive material 740 may also be a semiconductor material or a polysilicon material of a first conductivity type, to form a polydiode structure between the first outdiffusion region 320, the conductive material 740 and the second outdiffusion region 322. The conductive material 740 may comprise, for example tungsten or titanium.

According to an embodiment, the trench 450 may be etched, thereafter the trench sidewalls 451 may be doped or be lined with an PSG/anneal/PSG glass wet etch. Herein, in a first step, the trench 450 is etched through the oxide stack of the second isolation layer 400, stopping on the polysilicon layer 300. Then, for selective wet etching of the later deposited PSG glass (and not the BPSG of the second dielectric layer 420), a thin nitride layer (e.g. in a range of 20 to 50 nm) $Si_3N_4$ (or SiON) may be deposited on BPSG top and BPSG sidewalls. This is followed by the silicon trench process, PSG fill and outdiffusion, and wet etching of PSG and nitride. Thereafter the trench sidewalls 451 are lined with $TiSi_2$ or $CoSi_2$, TiN and a conductive material 740 such as W, AlCu, AlSiCu, or Cu.

An advantage of the structure as described above is the stable manufacturing process, since a vertical relative variation of implantation tails, which occur at a variation or a change of layer thickness in a vertical direction of the polysilicon layer 300 or straying oxides does not have an impact on the forming of the electrostatic discharge protection structure.

FIG. 14 is a schematic plan view of a portion of a semiconductor device 10 comprising an electrostatic discharge protection structure 310 formed in a polysilicon layer 300 of a second conductivity type in accordance with an embodiment.

The structure as shown in FIG. 14 may be a portion of a semiconductor device 10 as shown, for example in FIG. 3 or in FIG. 8 as described above. Herein, FIGS. 3 and 8 may also be schematic cross-sectional views of a portion of a semiconductor device 10 taken along a section plane C-C' of FIG. 14 in accordance with different embodiments.

It shall be noted that FIG. 3 and FIG. 8 show schematic cross-sectional views of a portion of a semiconductor device 10 along a section plane extending through the electrostatic discharge protection part 310a of the electrostatic discharge protection structure 310. In the following, the edge termination part 310b of the electrostatic discharge protection structure 310 will be explained in all detail.

As can be seen from FIG. 14, the electrostatic discharge protection structure 310 comprises a polysilicon layer 300, which may be formed on the first isolation layer 200 and the semiconductor body 100 as shown in FIG. 3 or FIG. 8. In the embodiment of FIG. 14, the polysilicon layer 300 may be of a second conductivity type, wherein a part of the polysilicon layer 300 forming the first region main part 316a may be of a first conductivity type. The second regions 318 may each comprise a second region main part 318a, which is extended from the electrostatic discharge protection part 310a into the edge termination part 310b. The second region main part 318a may be formed as described above with regard to FIGS. 10A to 10G. Next to the second region main part 318a, the second region end part 318b is formed in the edge termination part 310b. The second region end part 318b may be a part of the polysilicon layer 300 of the second conductivity type which remains after the second region main part 318a is formed in the polysilicon layer 300.

As can be further seen from FIG. 14, the first terminal 312 comprises the first terminal main part 312a and the first terminal end part 312b. Furthermore, the second terminal 314 comprises the second terminal main part 314a and the second terminal end part 314b. The first/second terminal main parts 312a, 314a may be formed in the same way as the second region main part 318a and as shown in FIG. 10A to 10G. The first terminal 312 and the second terminal 314 are not part of the diode structure 315.

As mentioned above, the first region main parts 316a may be a part of the polysilicon layer 300 remaining after forming the second region main part 318a in the polysilicon layer 300. In case of providing a polysilicon layer 300 of a second conductivity type and forming a part of the polysilicon layer 300 of a first conductivity type by implanting dopants of a first conductivity type into the polysilicon layer 300, the net dopant concentration of the first region main parts 316a may be homogeneous in the lateral directions x, y when averaged over the vertical direction z in the polysilicon layer 300. The thickness of the polysilicon layer 300 in the vertical direction z may be in a range of 200 nm to 500 nm. The implantation dose of first dopants may be in a range of $1\times10^{13}$ cm$^{-3}$ to $5\times10^{13}$ cm$^{-3}$. Thus, the net dopant concentration of the first region main parts 316a may be in a range of $1\times10^{17}$ cm$^{-3}$ to $10\times10^{17}$ cm$^{-3}$. The first region main parts 316a of the first conductivity type may be of a p-type. In this case, boron ions may be implanted to form the first region main parts 316a.

The second region main parts 318a of the second conductivity type may be of an n-type as described above. In particular, the at least one second region 318 and, in particular, the at least one second region main part 318a, may comprise first and second out diffusion regions 320, 322 and an intermediate region 324, wherein the intermediate region 324 is sandwiched between the first and second out diffusion regions 320, 322 in the first lateral direction x, as discussed above with regard to FIGS. 3 and 8. Herein, the first regions 316, in particular the first region main parts 316a, and the first and second out diffusion regions 320, 322 may comprise first dopants of a first conductivity type, and the first and second out diffusion regions 320, 322 may further comprise second dopants of the second conductivity type overcompensating the first dopants. The intermediate region 324 may comprise n-doped polysilicon having a net dopant concentration higher than $1\times10^{19}$ cm$^{-3}$. The intermediate region 324 may, however, also comprise a metal.

The semiconductor device 10 may further comprise the heat dissipation structure 700 having the first end 701 in direct contact with the intermediate region 324 of the second region main part 318a of the electrostatic discharge protection structure 310 and a second end 702 in direct contact with an electrically isolating region 430 or 1000, as shown in FIG. 3 of FIG. 8. The intermediate region 324 of the second region main part 318a and the heat dissipation structure 700 may include a same material. According to an embodiment, the semiconductor device 10 may further comprise the second isolation layer 400 on the electrostatic discharge protection structure 310, the gate contact area 510 on the second isolation layer 400, wherein the gate contact area 510 may be electrically coupled to the first terminal 312 of the electrostatic discharge protection structure 310 via a first contact structure 800, and a source contact area 610 on the second isolation layer 400, wherein the source contact area 610 may be electrically coupled to the second terminal 314 of the electrostatic discharge protection structure 310 via a second contact structure 900. The first contact structure 800 and the intermediate region 324 of the second region main part 318a may include a same material.

In addition, as shown in FIG. 8, the semiconductor device 10 may comprise transistor cells 20 comprising source and body zones 150, 160 in the semiconductor body 100, wherein the source zones 150 are electrically coupled to the source contact area 610 via the second contact structure 900, and wherein the second contact structure 900 and the intermediate region 324 of the second region main part 318a may include a same material.

The net dopant concentration of the polysilicon layer 300 of the second conductivity type surrounding the part of the polysilicon layer 300 of the first conductivity type forming the first region main parts 316a may be in a range of $1\times10^{15}$ cm$^{-3}$ to $1\times10^{17}$ cm$^{-3}$. By providing the polysilicon layer 300 of the second conductivity type in the edge termination part 310b, which surrounds the second region main parts 318a and forms the second region end parts 318b, electric field peaks may be reduced or prevented at the boundary regions of the second region main parts 318a in the edge termination part 310b. The first region main parts 316a may be parts of the polysilicon layer 300 of a first conductivity type beside the at least one second region 318.

The first region end parts 316b in the edge termination part 310b may be formed within the polysilicon layer 300 by implanting dopants of the first conductivity type into the polysilicon layer 300 in the edge termination part 310b. The net dopant concentration in the first region end parts 316b may be lower than the net dopant concentration in the first region main parts 316a by using, for example half-tone masks. Thus, the net dopant concentration in the edge termination part 310b may be made lower than in the electrostatic discharge protection part 310a.

Figure 15A:
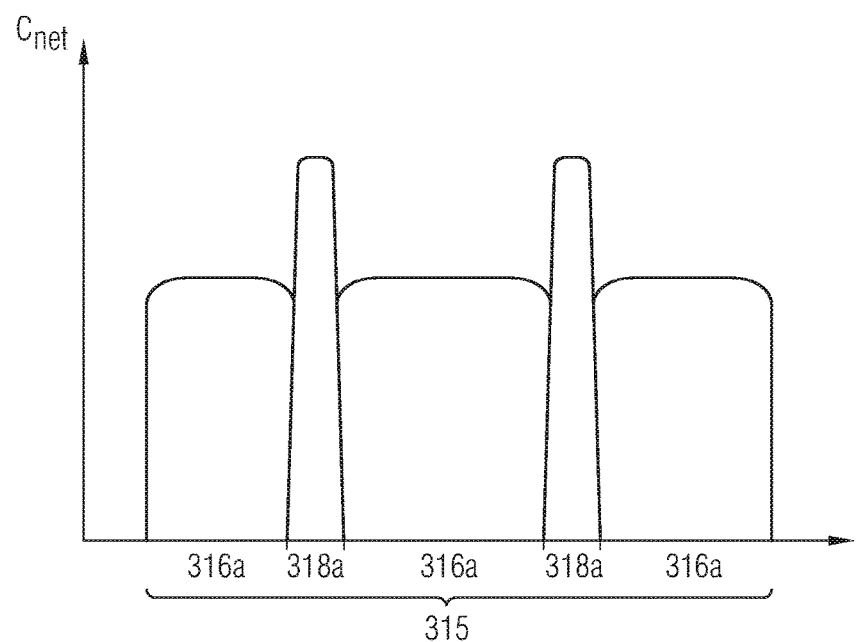
FIGS. 15A and 15B are diagrams illustrating a net dopant profile along a section plane C-C' and along a section plane D-D' of FIG. 14, respectively, according to an embodiment.
Figure 15B:
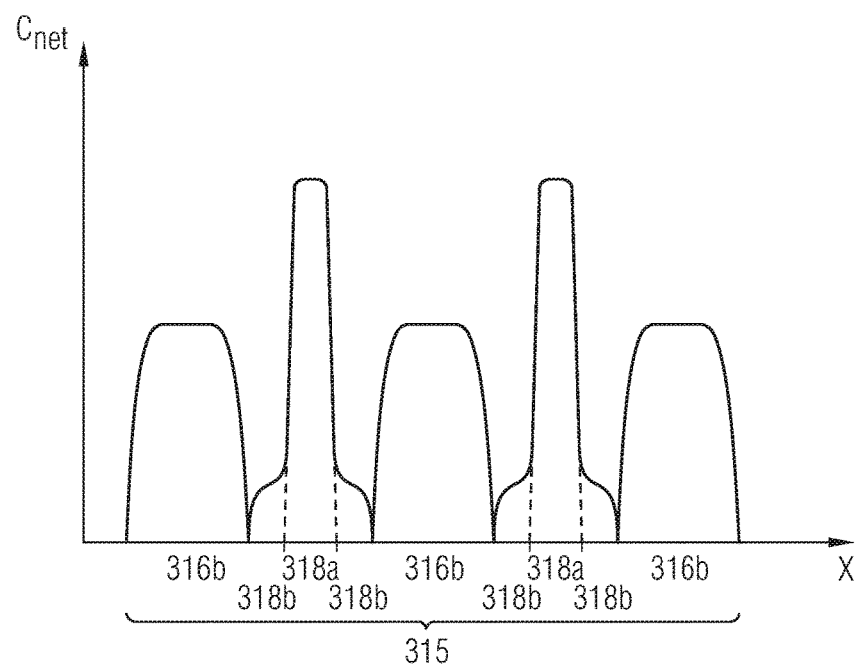

FIG. 15A shows a net dopant concentration of the diode structure 315 in the electrostatic discharge protection part 310a along the second plane C-C' of FIG. 14 along the first lateral direction x, and FIG. 15B shows a net dopant concentration of the diode structure 315 in the edge termination part 310b along the section plane D-D' of FIG. 14 along the first lateral direction x. The scaling of the charts shown in FIGS. 15A and 15B may be logarithmic.

As can be seen from FIGS. 15A and 15B, a net dopant concentration averaged along the first lateral direction x of the diode structure 315 in the electrostatic discharge protection part 310a (FIG. 15A) is higher than a net dopant concentration averaged along the first lateral direction x of the diode structure 315 in the edge termination part 310b (FIG. 15B). As a consequence, the diode structure 315 has a lower breakdown voltage in the electrostatic discharge protection part 310a compared to the breakdown voltage in the edge termination part 310b.

In case the at least two second regions 318 are equidistantly spaced apart from each other along the first lateral direction x as shown in FIG. 14, a well-defined diode structure 315 is formed, which has furthermore a bidirectional symmetric breakdown behaviour. Due to the provision of the edge termination part 310b having a higher breakdown voltage, a well-defined breakdown behaviour can be achieved in the electrostatic discharge protection structure 310.

Figure 16:
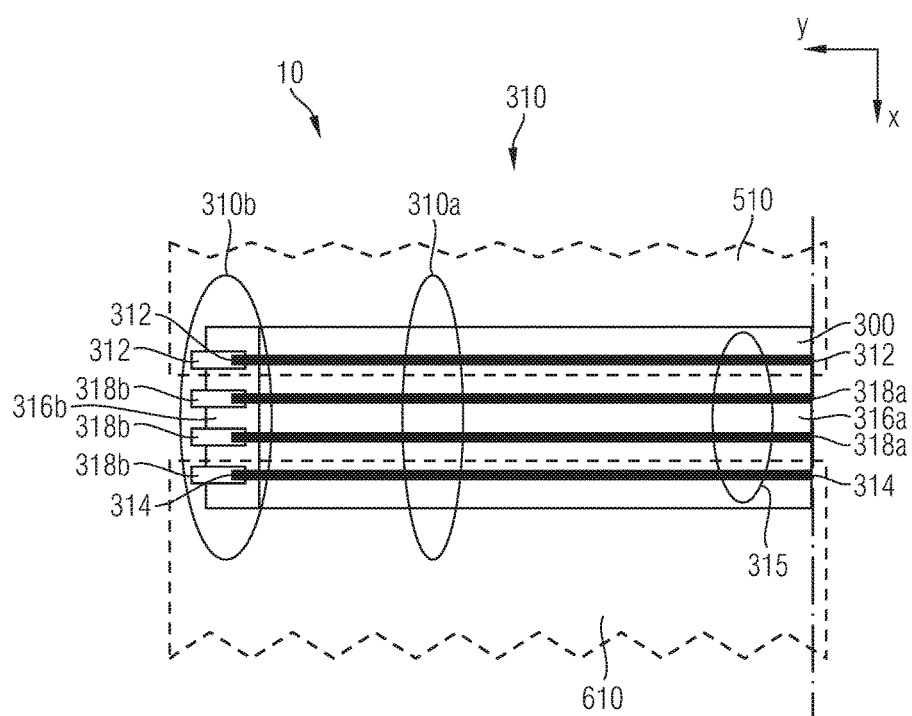
FIG. 16 is a schematic plan view of a portion of a semiconductor device comprising an electrostatic discharge protection structure formed in a polysilicon layer of a first conductivity type in accordance with an embodiment.

FIG. 16 is a schematic plan view of a portion of a semiconductor device 10 comprising an electrostatic discharge protection structure 310 formed in polysilicon layer 300 of a first conductivity type in accordance with an embodiment.

As can be seen from FIG. 16, the electrostatic discharge protection structure 310 may also be formed by providing a polysilicon layer 300 of a first conductivity type, wherein the net dopant concentration in the polysilicon layer 300 in the electrostatic discharge protection part 310a may be higher than in the edge termination part 310b. The polysilicon layer 300 may form the first regions 316, wherein the second regions 318 are formed by an implanting process of dopants of a second conductivity type. Herein, the second region main parts 318a may be formed as described with regard to FIG. 10A to 10G. The second region end parts 318b may be formed by implanting dopants of a second conductivity type in the edge termination part 310b to cover the second region main parts 318a. The second region end parts 318b may be formed as rectangular stripes. It shall be emphasized that the second region 318 and, in particular, the second region main parts 318a may also be formed by implanting dopants of a second conductivity type in the polysilicon layer 300 by a lithographic process, without using the manufacturing method as described with regard to FIG. 10A to 10G, in which outdiffusion regions 320, 322 are formed by filling trenches with a polysilicon material used as a dopant source in the polysilicon layer 300.

Figure 17:
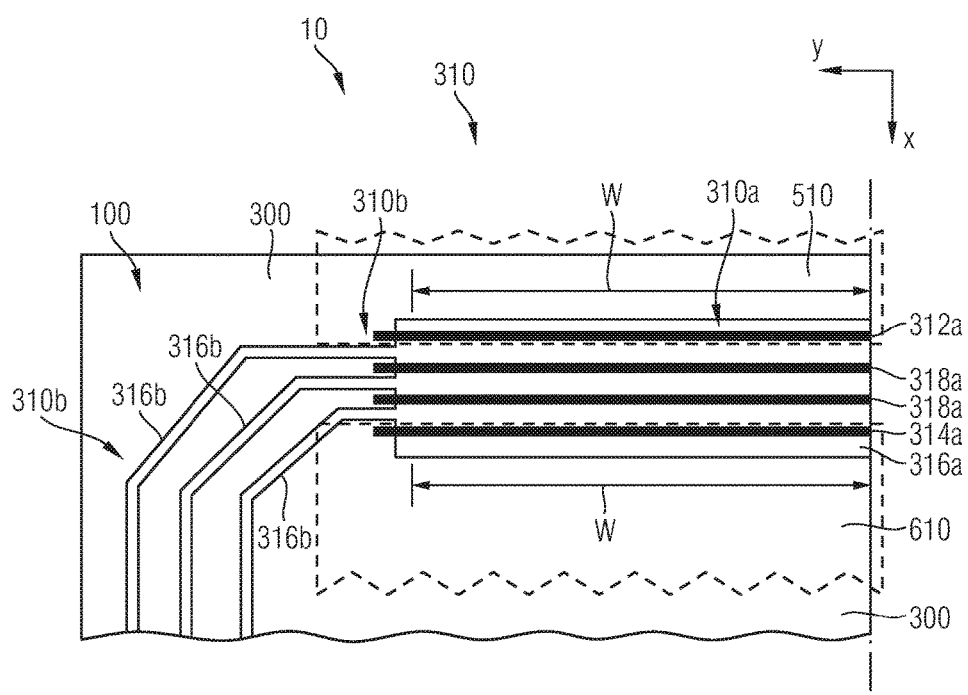
FIG. 17 is a schematic plan view of a portion of a semiconductor device comprising an electrostatic discharge protection structure having first region end parts each having a form of a closed loop in accordance with an embodiment.

FIG. 17 is a schematic plan view of a portion of a semiconductor device 10 comprising an electrostatic discharge protection structure 310 in accordance with another embodiment. As can be seen from FIGS. 14 and 16, the polysilicon layer 300 has a rectangular form and has an edge portion at a side being opposite to the boundary portion between the edge termination part 310b and the electrostatic discharge protection part 310a. At the edge portion of the polysilicon layer 300 in the edge termination part 310b there is both a transient (within a breakdown scenario or a commutating/switching operation) and a static electric field. Depending on the quality of the sidewall surface (surface states, local energy levels in the band gap for trapping centers) degradation effects may occur. These effects may be prevented by providing a structure of an electrostatic discharge protection structure 310 as shown in FIG. 17.

An electric field free edge region of the electrostatic discharge protection structure 310 may be advantageous as it is common in edge termination structures of semiconductor power devices (e.g. superjunction or IGBT devices having a highly doped termination region). Beside the electric field free space within the edge termination part 310b, an additional electric field free region shall be provided to a source region of a transistor cell area, as shown for example in FIG. 8. The transistor cells 20 may comprise superjunction MOS cells, SFET cells or IGBT cells. Thus, a structure is provided, in which the edge termination part 310b may be pinned to a source potential, wherein the electrostatic discharge protection part 310a may be pinned to a gate potential.

An electrostatic discharge protection structure 310 providing the possibility to pin the edge termination part 310b to a source potential and the electrostatic discharge protection part 310a to a gate potential without leading to a short circuit is shown in FIG. 17. Herein, the first region end parts 316b each have a form of a closed loop in the polysilicon layer 300 of a second conductivity type. Thus, the first region end parts 316b form, together with the first region main parts 316a an annular structure or a multiple closed loop structure within the lateral plane, i.e. a plane parallel to the first surface 101. The net dopant concentration in the first region end parts 316b may be equal to the net dopant concentration of the first region main parts 316a. By providing a structure as shown in FIG. 17, a junction field isolation may be provided between the first and second regions 316, 318 within the edge termination part 310b.

In a case of an electrostatic discharge breakdown of the electrostatic discharge protection structure 310, the diode structure 315 in the electrostatic discharge protection part 310a having the diode width W and having the lowest breakdown voltage dissipates the electrostatic discharge energy.

Figure 18:
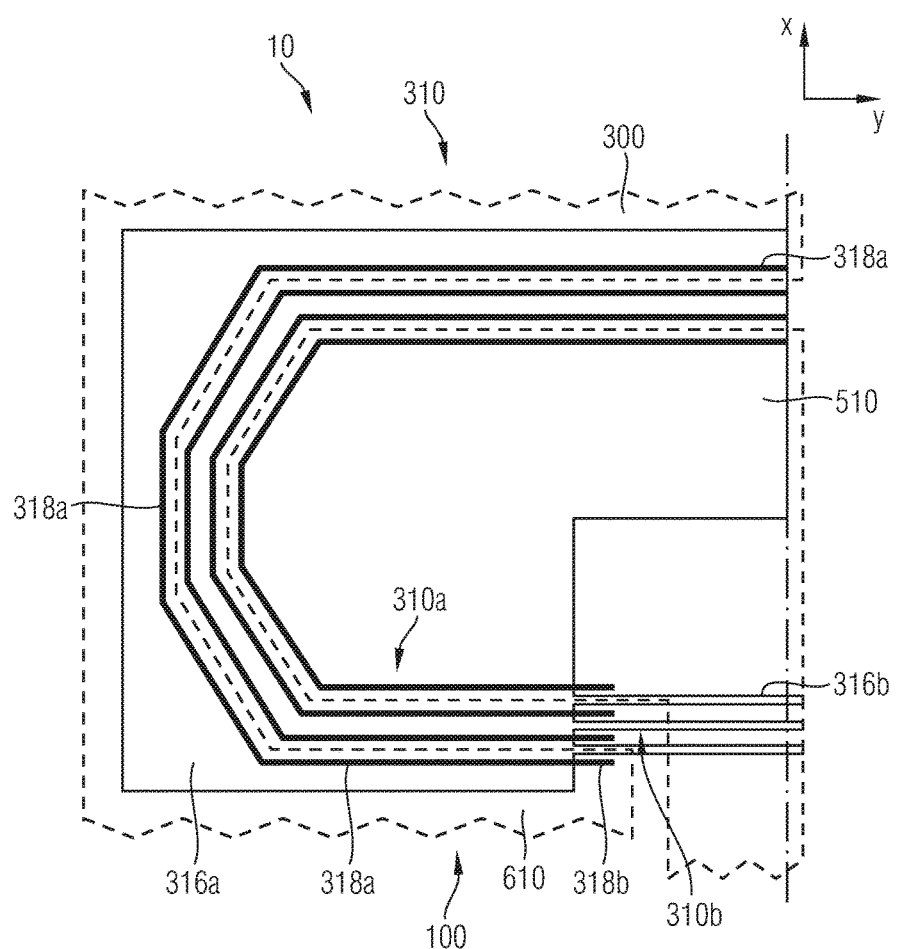
FIG. 18 is a schematic plan view of a portion of a semiconductor device comprising an electrostatic discharge protection structure having first region end parts each having a form of a closed loop and second region main parts each having a polygonal form in accordance with an embodiment.

In order to enlarge the diode width W, the structure as shown in FIG. 17 may be further changed to a structure as shown in FIG. 18. This structure takes use of the effect that highly doped Zener diode structures have a pinned space charge region with a lateral dimension below 0.1 µm to 0.5 µm along the pn-junction area. In such a structure, the distance between the second region main parts 318a may be homogeneously aligned along the diode width direction, to prevent local differences of the differential series resistances within the diode structure 315 of the electrostatic discharge protection part 310a. As can be seen from FIG. 18, the electrostatic discharge protection part 310a may have a polygonal form in a lateral plane parallel to the first surface 101.

FIG. 19 is a schematic plan view of a portion of a semiconductor device 10 comprising separate electrostatic discharge protection parts 310a each sharing first region end parts 316b having a form of a closed loop in accordance with an embodiment. As can be seen from FIG. 19, more than one electrostatic discharge protection parts 310a may be provided. In the embodiment as shown in FIG. 19, two further electrostatic discharge protection part 310'a are provided for protecting the semiconductor device 10 in case of an electrostatic discharge event. The electrostatic discharge protection parts 310a and 310'a each have edge termination parts 310b, which are interconnected between the respective electrostatic discharge protection parts 310a, 310'a. The electrostatic discharge protection structure 310 may be employed, for example, in a semiconductor device 10 having a first electrode 500 or a gate contact area 510 and the second electrode 600 or a source contact area 610, as shown in FIG. 2B, for example.

As described above, a monolithic integration of an electrostatic discharge protection structure 310 is provided for gate pads in high voltage power semiconductor devices. In addition, a self-aligned poly-emitter diode cascade may be formed in a polysilicon layer 300. Polysilicon plugs may act both as a first and second contact structure 800, 900 and as intermediate regions 324 providing a high emitter efficiency. In order to guide a metallization line of a one-layer power metallization layer to an inner electrode of the diode, the highly doped polysilicon contact regions are locally disrupted. The respective anode regions outside the active diode cascade structure form closed loops with reduced thickness and/or lower net dopant concentration, leading to a cascaded junction barrier isolation structure.

In addition to the outer termination of the diode structure, a field stop region is formed due to the locally provided p-doped region and a highly doped n-type diode polysilicon. Thus, sidewall effects (surface states) of the structured diode polysilicon may be eliminated. The ends of the polysilicon trenches of the second region end parts 318b are located in n-type regions, thus local electric field peaks at the trench ends may be prevented or reduced. The additional costs for integrating an electrostatic discharge protection structure 310 in a superjunction/IGBT/SFET process may be reduced to about 50%. Although no structure of multiple layer metallization is shown, the described electrostatic discharge protection structure 310 may also be used in discrete semiconductors and integrated circuits having a multilayer metal system, insofar highly doped polysilicon plugs are used as the lowest wiring layer.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
   a semiconductor body having a first surface and a second surface opposite to the first surface;
   a first isolation layer on the first surface of the semiconductor body; and an electrostatic discharge protection structure comprising a diode structure on the first isolation layer, the electrostatic discharge protection structure including a first terminal and a second terminal, wherein the diode structure comprises a polysilicon layer having first regions and at least one second region of opposite conductivity type alternatingly arranged along a first lateral direction between the first terminal and the second terminal, wherein the diode structure extends from an electrostatic discharge protection part into an edge termination part along a second lateral direction, and wherein a first breakdown voltage associated with the diode structure in the electrostatic discharge protection part is smaller than a second breakdown voltage associated with the diode structure in the edge termination part, wherein the first lateral direction and the second lateral direction run parallel to the first surface of the semiconductor body, wherein the first lateral direction and the second lateral direction run perpendicular with respect to one another in the same plane.

2. The semiconductor device of claim 1, wherein a net dopant concentration averaged along the first lateral direction of the diode structure in the electrostatic discharge protection part is higher than a net dopant concentration averaged along the first lateral direction of the diode structure in the edge termination part.

3. The semiconductor device of claim 1, wherein the at least one second region comprises a second region main part in the electrostatic discharge protection part and the edge termination part, and a second region end part in the edge termination part, wherein the net dopant concentration averaged in the second region end part is lower than the net dopant concentration averaged in the second region main part.

4. The semiconductor device of claim 3, wherein the second region end part is arranged next to the second region main part along the second lateral direction.

5. The semiconductor device of claim 3, wherein the second region end part is arranged next to the second region main part along the first lateral direction.

6. The semiconductor device of claim 1, wherein the first terminal and the second terminal include a region of the polysilicon layer of the second conductivity type.

7. The semiconductor device of claim 1, wherein at least two second regions are equidistantly spaced apart from each other along the first lateral direction.

8. The semiconductor device of claim 1, wherein the first regions each comprise a first region main part in the electrostatic discharge protection part and a first region end part in the edge termination part.

9. The semiconductor device of claim 8, wherein the net dopant concentration averaged in the first region end part is lower than the net dopant concentration averaged in the first region main part.

10. The semiconductor device of claim 8, wherein the first region main parts are parts of the polysilicon layer of a first conductivity type beside the at least one second region.

11. The semiconductor device of claim 8, wherein the first region end parts each have a form of a closed loop in the polysilicon layer of a second conductivity type.

12. The semiconductor device of claim 1, wherein the at least one second region comprises first and second outdiffusion regions and an intermediate region, the intermediate region being sandwiched between the first and second outdiffusion regions in the first lateral direction.

13. The semiconductor device of claim 12, wherein the first regions and the first and second outdiffusion regions comprise first dopants of a first conductivity type, wherein the first and second outdiffusion regions further comprise second dopants of the second conductivity type overcompensating the first dopants.

14. The semiconductor device of claim 12, wherein the intermediate region comprises n-doped polysilicon having a net dopant concentration higher than $1\times10^{17}$ cm-3.

15. The semiconductor device of claim 12, wherein the intermediate region comprises a metal.

16. The semiconductor device of claim 12, further comprising a heat dissipation structure having a first end in direct contact with the intermediate region of the electrostatic discharge protection structure and a second end in direct contact with an electrically isolating region.

17. The semiconductor device of claim 16, wherein the intermediate region and the heat dissipation structure include a same material.

18. The semiconductor device of claim 1, further comprising:
a second isolation layer on the electrostatic discharge protection structure;
a gate contact area on the second isolation layer, the gate contact area being electrically coupled to the first terminal of the electrostatic discharge protection structure via a first contact structure; and
a source contact area on the second isolation layer, the source contact area being electrically coupled to the second terminal of the electrostatic discharge protection structure via a second contact structure.

19. The semiconductor device of claim 18, wherein the first contact structure and the at least one second region include a same material.

20. The semiconductor device of claim 18, further comprising transistor cells comprising source and body zones in the semiconductor body, wherein the source zones are electrically coupled to the source contact area via the second contact structure, wherein the second contact structure and the at least one second region include a same material.

* * * * *